United States Patent
Evans et al.

(10) Patent No.: US 10,707,857 B2
(45) Date of Patent: Jul. 7, 2020

(54) METHODS AND APPARATUS TO IMPROVE SWITCHING CONDITIONS IN A CLOSED LOOP SYSTEM

(71) Applicant: Texas Instruments Incorporated, Dallas, TX (US)

(72) Inventors: David Wayne Evans, Bentonville, AR (US); Kavitha Rapolu, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/353,853

(22) Filed: Mar. 14, 2019

(65) Prior Publication Data
US 2020/0036373 A1    Jan. 30, 2020

Related U.S. Application Data

(60) Provisional application No. 62/703,501, filed on Jul. 26, 2018.

(51) Int. Cl.
*H03K 17/082* (2006.01)
*H03M 1/08* (2006.01)
*H03K 17/08* (2006.01)

(52) U.S. Cl.
CPC . *H03K 17/0822* (2013.01); *H03K 2017/0806* (2013.01); *H03M 1/0863* (2013.01)

(58) Field of Classification Search
CPC ...... H03K 17/0822; H03K 2017/0806; H03M 1/0863

USPC .......................... 327/108, 109, 110, 111, 112
See application file for complete search history.

(56) References Cited

U.S. PATENT DOCUMENTS 6,137,329 A * 10/2000 Kardash ............... H03K 17/166
327/110

FOREIGN PATENT DOCUMENTS

| DE | 102011079552 A1 | 1/2013 |
| GB | 2553474 A | 3/2018 |
| RU | 2447577 C1 | 10/2011 |

OTHER PUBLICATIONS

Linear Technology, "Voltage-Controlled Pulse Width Modulator (PWM)," Linear Technology Corporation, retrieved on Mar. 8, 2019, 34 pages.

(Continued)

*Primary Examiner* — John W Poos
(74) *Attorney, Agent, or Firm* — Michael A. Davis, Jr.; Charles A. Brill; Frank D. Cimino

(57) ABSTRACT

Methods, apparatus, systems and articles of manufacture are disclosed to improve switching conditions in a closed loop system. An example device includes a first switch adapted to be coupled to a first node, a second switch adapted to be coupled to a second node, a capacitor including a first terminal and a second terminal, wherein the first terminal is coupled the first switch, and wherein the second terminal is coupled to the second switch, a first multiplier coupled to the first terminal and to the second terminal, wherein the first multiplier is adapted to be coupled to at least a third node and a fourth node, and a second multiplier coupled to the first terminal and to the second terminal.

19 Claims, 11 Drawing Sheets

(56) References Cited

OTHER PUBLICATIONS

Search Report for PCT Application No. PCT/US19/43465, date of mailing of the international search report dated Oct. 31, 2019, 1 page.
GB2553474A, Machine Translation, 36 pages.
DE102011079552A1, Machine Translation, 17 pages.
RU2447577C1, Machine Translation, 10 pages.

* cited by examiner

METHODS AND APPARATUS TO IMPROVE SWITCHING CONDITIONS IN A CLOSED LOOP SYSTEM

RELATED APPLICATION

This patent arises from an application claiming the benefit of U.S. Provisional Patent Application Ser. No. 62/703,501, which was filed on Jul. 26, 2018. U.S. Provisional Patent Application Ser. No. 62/703,501 is hereby incorporated herein by reference in its entirety. Priority to U.S. Provisional Patent Application Ser. No. 62/703,501 is hereby claimed.

FIELD OF THE DISCLOSURE

This disclosure relates generally to gate drivers, and, more particularly, to methods and apparatus to improve switching conditions in a closed loop system.

BACKGROUND

High-voltage and/or high-current applications utilize power electronic devices capable of efficient and effective operation at elevated temperatures. In such applications, power modules provide power using power metal-oxide-semiconductor field-effect transistors (MOSFETs). The power MOSFETs may be used as power delivering devices to support tens or hundreds of amperes during normal operation to deliver power to a load.

BRIEF DESCRIPTION OF THE DRAWINGS

The figures are not to scale. In general, the same reference numbers will be used throughout the drawing(s) and accompanying written description to refer to the same or like parts.

Figure 1:
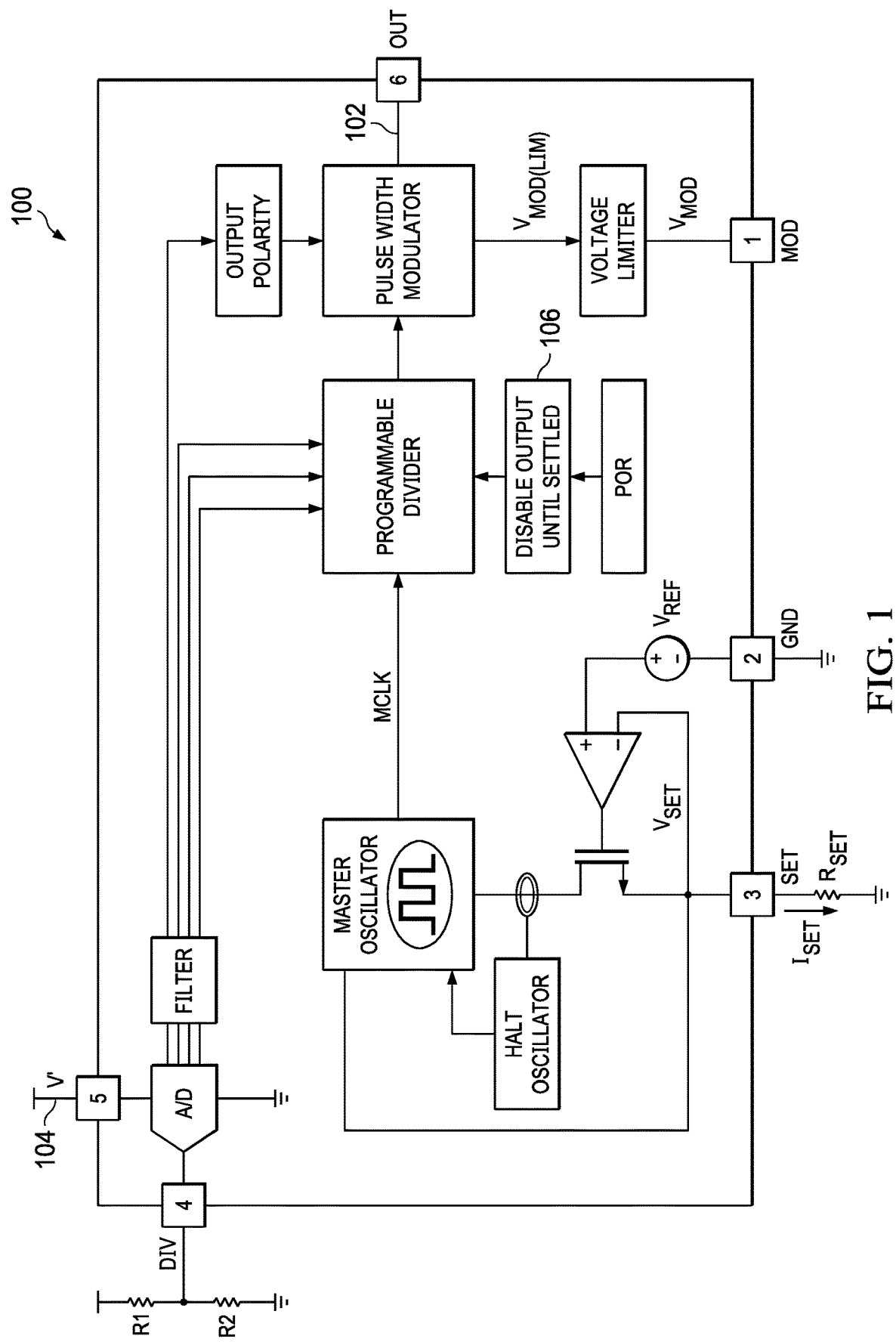
FIG. 1 is a block diagram illustrating a device to halt an output signal until an input signal is stable.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

High-voltage and/or high-current isolated gate driver environments and applications, such as a traction inverter in an electric vehicle (EV), a hybrid-electric vehicle (HEV), etc., utilize power electronic devices capable of efficient and effective operation at elevated temperatures. Power delivery and/or management modules have been developed to provide the required power using low-impedance power MOSFETs made from Silicon Carbide (SiC). Power SiC MOSFETs may be used as power delivering devices to support tens or hundreds of amperes during normal operation to deliver the power to a load. Alternatively, power modules have been developed using low impedance isolated gate bipolar transistor (IGBT) devices to satisfy the necessary power requirements for applications such as traction inverters for EVs, HEVs, etc.

In such high-power applications, the temperature of the power SiC MOSFET can increase to levels damaging to the SiC MOSFET, a load coupled to the SiC MOSFET, and/or surrounding components. In such isolated high-voltage and/or high-current gate driver environments and applications, an analog signal representative of SiC MOSFET temperature may be sensed and converted to a digital temperature signal for use by an accompanying controller (e.g., a Microcontroller Unit (MCU)). In response to obtaining the digital temperature signal, the MCU can adjust the switching speed and/or halt operation of the SiC MOSFET. The digital temperature signal can be utilized by the accompanying controller (e.g., a MCU) to indirectly control the temperature of the SiC MOSFET, or respective switching device.

A converter (e.g., an analog to pulse width modulator (A2PWM)) may be used to convert the analog signal representative of temperature to a digital temperature signal (e.g., a pulse width modulated signal (PWM signal)). In high-power and/or high-current gate driver applications, the converter is typically a noise-sensitive circuit designed included in the high-power and/or high-current gate driver to maintain performance specifications. Such performance specifications may include maintaining a desired overall accuracy across temperature, desired duty-cycle control, reducing missed or skipped pulses, and/or negligible phase distortion. In such noise-sensitive converters, unwanted inductive noise and/or ringing may contribute to a deviation away from the above-mentioned performance specifications, damage to interior components, a decrease performance efficiency, etc.

In isolated high-power and/or high-current gate driver applications, the switching characteristics of the converter (e.g., the switching speed, the total overshoot, settling time) typically dominate the switching characteristics (e.g., turn-on speed) of the example isolated high-power and/or high-current gate driver. For example, if the settling time of a compensation node converter is longer than the settling time of the isolated high-power and/or high-current gate driver signal, then the switching speed of the isolated high-power and/or high-current gate driver will reduce to a switching speed similar to the switching speed of the converter. Thus, when the converter is affected by unwanted inductive noise and/or ringing, the converter performance specifications may not be satisfied and the switching characteristics (e.g., the turn-on speed, the total overshoot) of the converter may be affected (e.g., the switching speed is slowed to over 100 milliseconds and/or the total overshoot is increased to unsafe levels). As a result of the converter performance degradation, the switching characteristics (e.g., the switching speed, the total overshoot) of the isolated high-power and/or high-current gate driver IC may be affected (e.g., the switching speed is slowed to over 100 milliseconds and/or the total overshoot is increased to unsafe levels).

Typical techniques to protect and/or ensure proper operation of a noise-sensitive converter include utilizing a large compensation capacitor (e.g., 200 picofarads) in circuit with an amplifier (e.g., internal to the amplifier or external to the amplifier) to ensure proper frequency compensation. For example, the bandwidth of the converter can be set, in part, by a dominant pole realized with a large compensation capacitor (e.g., 200 picofarads) at or across a compensation node in an operational amplifier in the converter. In such techniques, the method of frequency compensation may hereinafter be referred to as dominant pole compensation.

Additionally, when implementing dominate pole compensation, due to the large compensation capacitance inherent for proper frequency compensation, the startup time of the driving signals for the SiC MOSFET and/or suitable power switching device is delayed (e.g., delayed on the order of 500 microseconds to 1 millisecond). The switching characteristics of the converter may be affected and accordingly, because of the use of a large compensation capacitor (e.g., 200 picofarads) in the converter, the isolated high-voltage and/or high-power gate driver experiences undesirable switching characteristics (e.g., startup time delayed on the order of 500 microseconds to 1 millisecond and/or overshoot during a step response).

Figure 2:
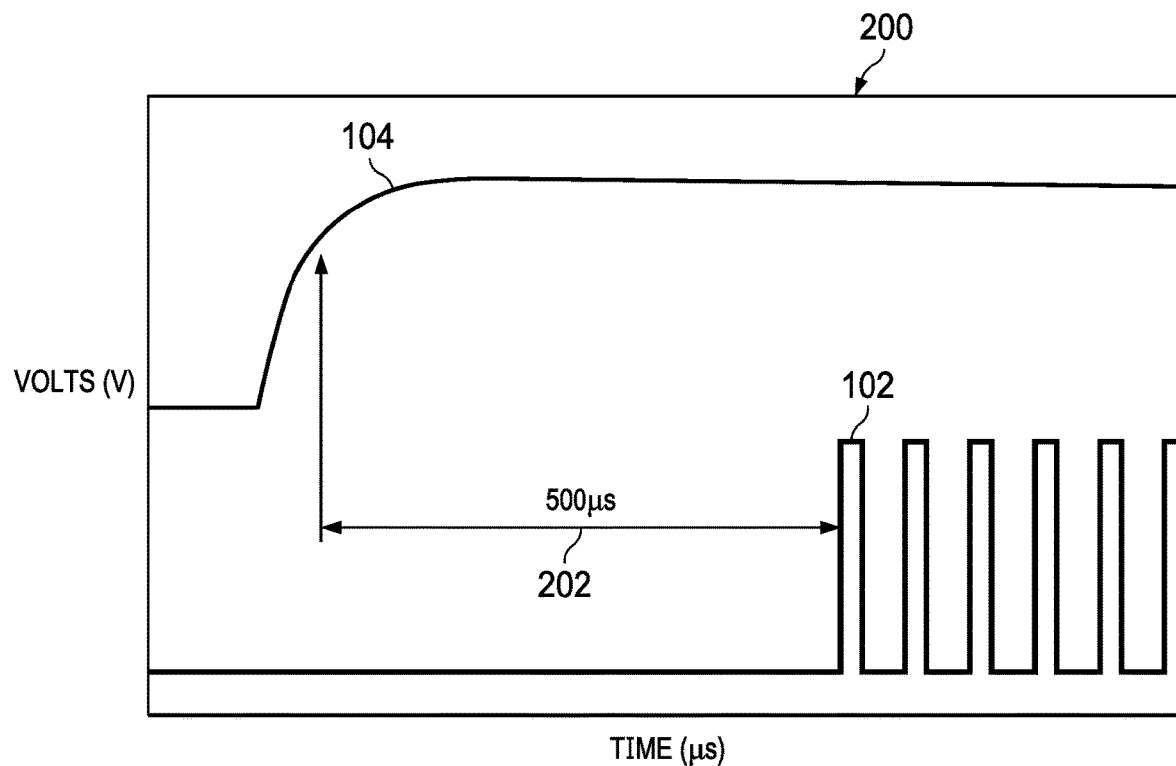
FIG. 2 is a graphical illustration of voltage versus time with respect to the output signal and the input signal of FIG. 1.

Alternatively, a technique to protect and/or ensure proper operation of a noise-sensitive converter includes delaying (e.g., halting) the output signal (e.g., PWM signal) until the input signal has settled (e.g., the input signal is no longer experiencing transients). FIG. 1 is a block diagram illustrating a device 100 to halt an output signal (line 102) until an input signal (line 104) is stable. The disabler 106 disables the output signal (line 102) for 500 microseconds. FIG. 2 is a graphical illustration 200 of voltage versus time with respect to the output signal (line 102) and the input signal (line 104) of FIG. 1. The delay segment 202 illustrates a 500-microsecond delay between the turn on time of the input signal (line 104) and the turn on time of the output signal (line 102). In FIG. 1, the startup time is delayed on the order of 500 microseconds.

Examples disclosed herein include methods and apparatus to protect and/or ensure proper operation of a noise sensitive converter while maintaining a fast (e.g., 60 microsecond) startup time. Examples disclosed herein include utilizing a converter (e.g., A2PWM) to convert an analog signal (e.g., an analog signal representative of temperature) to a digital signal (e.g., a PWM signal representative of temperature). Furthermore, examples disclosed herein include utilizing frequency compensation to ensure a proper converter loop bandwidth when converting an analog signal to a digital signal (e.g., an analog signal to a PWM signal). An example frequency compensation technique includes dominant pole compensation.

In examples disclosed herein, the bandwidth of the converter is set sufficiently low (e.g., 10 Hz to 100 Hz) to protect the noise-sensitive converter and to reject the noise and/or ringing due to the high-voltage and/or high-power switching. In examples disclosed herein, a large compensation capacitor (e.g., 200 picofarads) is realized at and/or across a compensation node in the converter (e.g., across a compensation node in an operational amplifier in the converter). Examples disclosed herein include methods and apparatus to improve switching characteristics in isolated high-voltage and/or high-power gate driver applications, or any suitable closed loop system, resulting from the use of a large compensation capacitor. Examples disclosed herein include charging and/or discharging individual terminals (e.g., plates) of the compensation capacitor to improve the switching conditions of the converter. In examples disclosed herein, the individual terminals of the compensation capacitor are charged and or discharged in response to meeting various voltage thresholds.

Examples disclosed herein include utilizing an isolated high-voltage and/or high-power gate driver. In such examples, the isolated high-voltage and/or high-power gate driver includes an isolated high-voltage side and an isolated low-voltage side. Example isolation techniques disclosed herein include capacitive isolation, optocoupled isolation, or any suitable isolation technique. Examples disclosed herein include sensing an analog voltage value representative of the temperature of the SiC MOSFET, IGBT, and/or any suitable power switching device. Examples disclosed herein include utilizing the sensed voltage value representative of the temperature of the SiC MOSFET, IGBT, and/or any suitable power switching device to regulate the temperature of the SiC MOSFET, IGBT, and/or any suitable power switching device.

In examples disclosed herein, at least one capacitor multiplier is used in the converter to generate the electrical effect of a large compensation capacitor (e.g., 200 picofarads) while using a small compensation capacitor (e.g., 10 picofarads). In such examples disclosed herein, a physically small compensation capacitor (e.g., 10 picofarads) is implemented in the converter, coupled to at least one capacitor multiplier. Furthermore, in such examples disclosed herein, the small compensation capacitor (e.g., 10 picofarads) coupled with the at least one capacitor multiplier acts, and is seen, as a large compensation capacitor (e.g., 200 picofarads).

In examples disclosed herein, at least one variable capacitor multiplier is used in connection with the above-mentioned at least one capacitor multiplier. In such examples disclosed herein, the variable capacitor multiplier includes a plurality of current mirrors including a plurality of current mirror branches. In examples disclosed herein, the variable capacitor multiplier can adjust the number of active current mirror branches to adjust the capacitance of the compensation capacitor and, thus, adjust the slew rate of the compensation node controlled by the capacitor accordingly.

Figure 3:
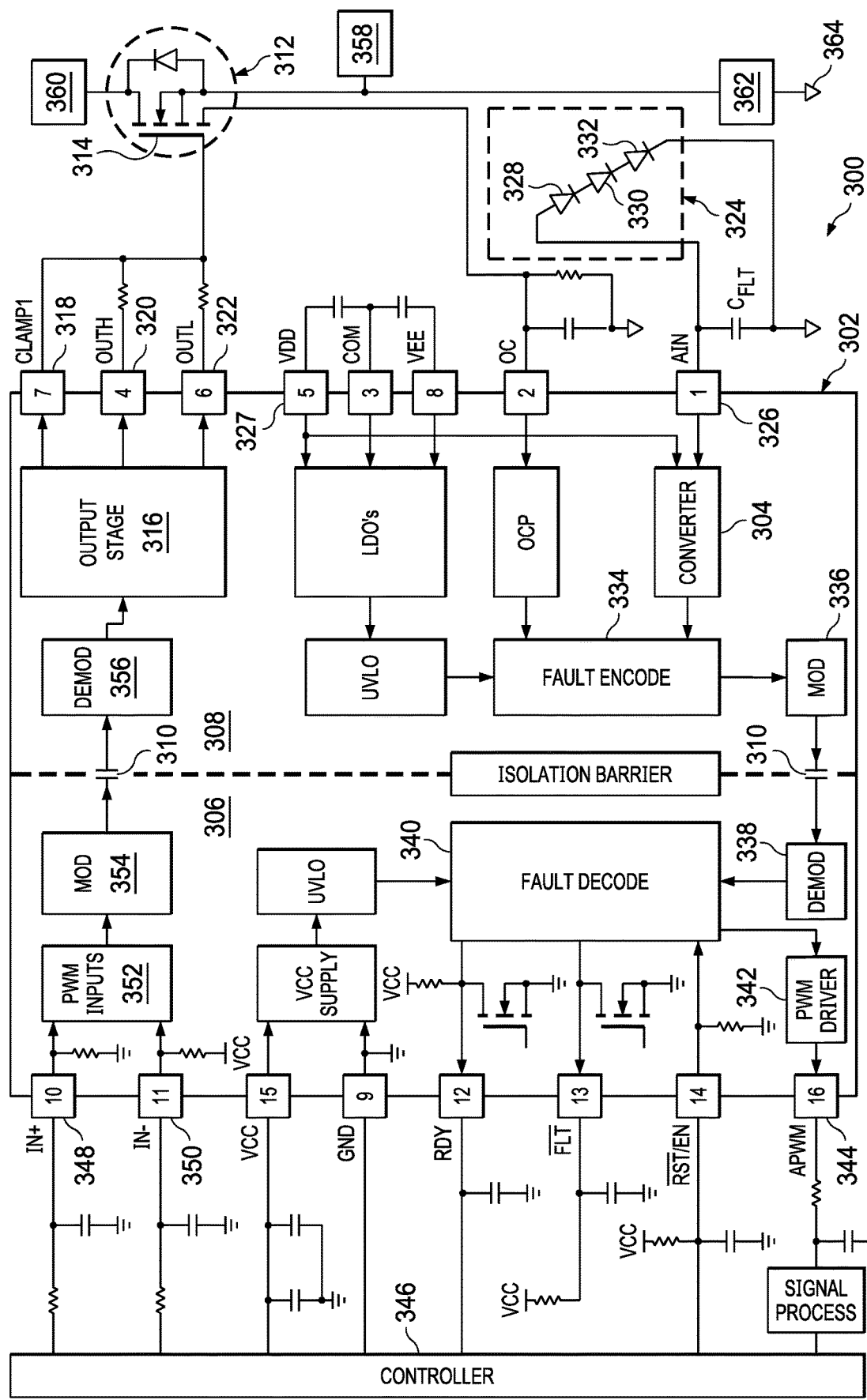
FIG. 3 is a schematic illustration of an example gate driver system including an example gate driver integrated circuit (IC) that includes an example converter to implement the examples disclosed herein.

FIG. 3 is a schematic illustration of an example gate driver system 300 including an example gate driver integrated circuit (IC) 302 that includes an example converter 304 to implement the examples disclosed herein. The gate driver IC 302 is a high-voltage (e.g., 800-volt (V) rating) isolated gate driver to provide power to a high-voltage and/or a high-current load. For example, the gate driver system 300 may be used to provide power to a traction inverter or any other type of electrical device included in an EV, a HEV, etc. Alternatively, the gate driver system 300 may be used to provide power to any other electrical device.

In the illustrated example of FIG. 3, the gate driver IC 302 includes an example low-voltage stage 306 and an example high-voltage stage 308. In FIG. 3, the low-voltage stage 306 is isolated from the high-voltage stage 308 using an example isolation barrier 310. For example, an electrical fault that occurs on the example high-voltage stage 308 is isolated from affecting (e.g., damaging, conducting current, etc.) the low-voltage stage 306. In examples disclosed herein, the gate driver IC 302 is implemented in an integrated circuit.

In examples disclosed herein, the low-voltage stage 306 is implemented on a first die (e.g., a silicon die) separate from the high-voltage stage 308, within the gate driver IC 302. Additionally, in examples disclosed herein, the high-voltage stage 308 is implemented on a second die (e.g., a silicon die) separate from the low-voltage stage 306, within the gate driver IC 302. In other examples disclosed herein, the low-voltage stage 306 and the high-voltage stage 308 may be implemented on a single die (e.g., a silicon die) within the gate driver IC 302. In other examples disclosed herein, the low-voltage stage 306 may be implemented on a plurality of dies (e.g., silicon dies) within the gate driver IC 302. In other examples disclosed herein, the high-voltage stage 308 may be implemented on a plurality of dies (e.g., silicon dies) within the gate driver IC 302. Alternatively, in other examples disclosed herein, the gate driver IC 302 and/or any of the components shown in the gate driver IC 302 may be implemented on a plurality of integrated circuits and/or any plurality of dies (e.g., silicon dies).

In the illustrated example of FIG. 3, the isolation barrier 310 is a capacitive isolation barrier. The isolation barrier 310 ensures that the electrical grounds between the low-voltage stage 306 and the high-voltage stage 308 are separated. In some examples disclosed herein, the isolation barrier 310 may be implemented as an inductive isolation barrier, an optocoupled isolation barrier, or any other suitable isolation barrier.

In the illustrated example of FIG. 3, an example switch 312 is a silicon carbide metal-oxide-semiconductor field-effect transistor (SiC MOSFET). Alternatively, the switch 312 may be any other suitable silicon carbide transistor (e.g., a silicon carbide IGBT). The switch 312 may be a MOSFET made from any other material (e.g., Silicon, Gallium Arsenide, etc.). Alternatively, the switch 312 may be any other power device such as an IGBT. In FIG. 3, an example gate 314 of the switch 312 is coupled to an example output stage IC 316 via one or more example IC pins (318, 320, 322). The IC pin 318 is pin 7 (CLAMPI) of the gate driver IC 302. The IC pin 320 is pin 4 (OUTH) of the gate driver IC 302. The IC pin 322 is pin 6 (OUTL) of the gate driver IC 302. Alternatively, the gate 314 may be coupled to the output stage IC 316 via one or more intervening connections, vias, nodes, etc.

The example output stage IC 316 includes any number of gate drivers to turn on and/or turn off the switch 312. For example, the output stage IC 316 may include an example high-side gate driver to turn on the switch 312 and an example low-side gate driver to turn off the switch 312.

In the illustrated example of FIG. 3, an example temperature sensor 324 is coupled in proximity to the switch 312 (e.g., 1 millimeter apart, 1 micrometer apart, etc.). In operation, the temperature sensor 324 senses and/or otherwise generates a signal (e.g., a voltage at the example first, second, and third sensing diodes 328, 330, 332) representative of the temperature of the switch 312. Furthermore, the temperature sensor 324 is coupled to the example IC pin 326 of the gate driver IC 302. The IC pin 326 is pin 1 (AIN) of the gate driver IC 302. In other examples disclosed herein, the temperature sensor 324 may be implemented as any suitable temperature sensing device (e.g., a thermocouple, a thermally sensitive resistor, a resistance temperature detector (RTD), etc.).

In the illustrated example of FIG. 3, the converter 304 is coupled to the IC pin 326 to obtain a signal (e.g., a voltage from the temperature sensor) representative of the temperature of the switch 312. In examples disclosed herein, the signal obtained at the IC pin 326 is an analog signal affected by inductive noise and/or ringing generated by the switch 312, coupled load, and/or any surrounding electrical device. The converter 304 obtains the analog signal corresponding to the temperature of the switch 312 from the IC pin 326 and converts the analog signal to a digital signal (e.g., a PWM signal) to be passed to an example controller 346 via the isolation barrier 310. The digital signal (e.g., PWM signal) includes a duty cycle that corresponds to the temperature of the switch 312 (e.g., 90% duty cycle corresponds to 200 degrees Fahrenheit). Additionally, the converter 304 is coupled to an example IC pin 327, which is pin 5 (VDD) of the gate driver IC 302.

In examples disclosed herein, the converter 304 obtains the analog signal corresponding to the temperature of the switch 312 from the IC pin 326 and converts the analog signal corresponding to the temperature of the switch 312 to a digital temperature signal. The converter 304 provides the digital temperature signal to pass through the isolation barrier 310 for the controller 346.

In the illustrated example of FIG. 3, an example fault encode IC 334 obtains at least the digital signal (e.g., PWM signal) representative of the temperature of the switch 312 from the converter 304. In examples disclosed herein, the fault encode IC 334 generates a corresponding fault signal in response to obtaining the digital signal from the converter 304. For example, the fault signal encoded by the fault encode IC 334 may correspond to a fault in the system 300 if the temperature of the switch 312 is too high (e.g., higher than a threshold temperature) or, the fault signal generated by the fault encode IC 334 may correspond to an absence of a fault in the system 300 if the temperature of the switch 312 is within the threshold temperature (e.g., normal operation).

In the illustrated example of FIG. 3, a first example modulator (MOD) IC 336 modulates the fault signal generated by the fault encode IC 334. In examples disclosed herein, the first MOD IC 336 modulates the frequency of the fault signal generated by the fault encode IC 334 to a frequency value high enough to pass through the isolation barrier 310 (e.g., 500 MHz). In such examples, the first MOD IC 336 is coupled to a first example demodulator (DEMOD) IC 338 via the isolation barrier 310.

In the illustrated example of FIG. 3, the first DEMOD IC 338 demodulates the previously mentioned modulated fault signal. In such examples, the first DEMOD IC 338 is coupled to an example fault decode IC 340.

In the illustrated example of FIG. 3, the fault decode IC 340 decodes at least the corresponding fault signal previously encoded by the fault encode IC 334. The output of the fault decode IC 340 is coupled to an example PWM driver 342.

In the illustrated example of FIG. 3, the PWM driver 342 is coupled to the controller 346 via an example IC pin 344. In examples disclosed herein, the IC pin 344 is pin 16 (APWM) of the gate driver IC 302.

In the illustrated example of FIG. 3, the gate driver system 300 includes the controller 346 to control and/or otherwise manage switch operations of the switch 312 via the gate driver IC 302. In FIG. 3, the controller 346 is an IC. Alternatively, the controller 346 may be implemented using hardware logic, machine readable instructions, hardware implemented state machines, etc., and/or a combination thereof.

In the illustrated example of FIG. 3, the controller 346 generates example signals (e.g., current signals) that are converted to example input voltages. The input voltages include a first example input voltage (IN+) that is obtained by the gate driver IC 302 at an example IC pin 348. The IC pin 348 is pin 10 of the gate driver IC 302. The input voltages include a second example input voltage (IN−) that is obtained by the gate driver IC 302 at an example IC pin 350. The IC pin 350 is pin 11 of the gate driver IC 302. The input voltages are converted to PWM signals by an example PWM input IC 352.

In the illustrated example of FIG. 3, the PWM input IC 352 generates and transmits the PWM signals to a second example modulator (MOD) IC 354 that modulates the PWM signals. The second MOD IC 354 transmits the modulated PWM signals to a second example demodulator (DEMOD) IC 356 that demodulates the PWM signals. The second MOD IC 354 transmits the modulated PWM signals to the second DEMOD IC 356 through the example isolation barrier 310. The second DEMOD IC 356 transmits the demodulated PWM signals to the output stage IC 316. The output stage IC 316 processes the demodulated PWM signals from the second DEMOD IC 356 to facilitate operation of at the switch 312. For example, the controller 346 may generate one or more control signals in response to the output of the converter 304 to facilitate operation of the switch 312. In examples disclosed herein, the switching conditions (e.g., the switching speed, total overshoot) of the one or more control signals generated by the controller 346 in response to the output of the converter 304 are improved (e.g., the undesirable switching speed or turn-on time occurring because of frequency compensation is reduced).

By turning on the switch 312, gate driver IC 302 provides power to an example load 358. For example, the load 358 can be an electric motor, a traction inverter, or any other type of electrical device included in an EV, an HEV, etc. Alternatively, the load 358 may be a battery, a power converter such as a half-bridge power converter (e.g., a boost converter, a buck converter, a buck-boost converter, etc.), etc. In FIG. 3, an example voltage source 360 is coupled to the switch 312. The voltage source 360 is a battery. Alternatively, the voltage source 360 may be a capacitor, a direct current (DC) voltage source, etc. In FIG. 3, the switch 312 provides power to the load 358. For example, the switch 312 can provide a voltage in a range of 400-1000 V, a current in a range of 100-1000 Amperes (A), etc., and/or a combination thereof to the load 358. In FIG. 3, there may be example one or more intermediate switches 362 coupled between the load and an example ground rail 364. The one or more intermediate switches 362 may be controlled by the controller 346 or any suitable external or internal controller.

Figure 4:
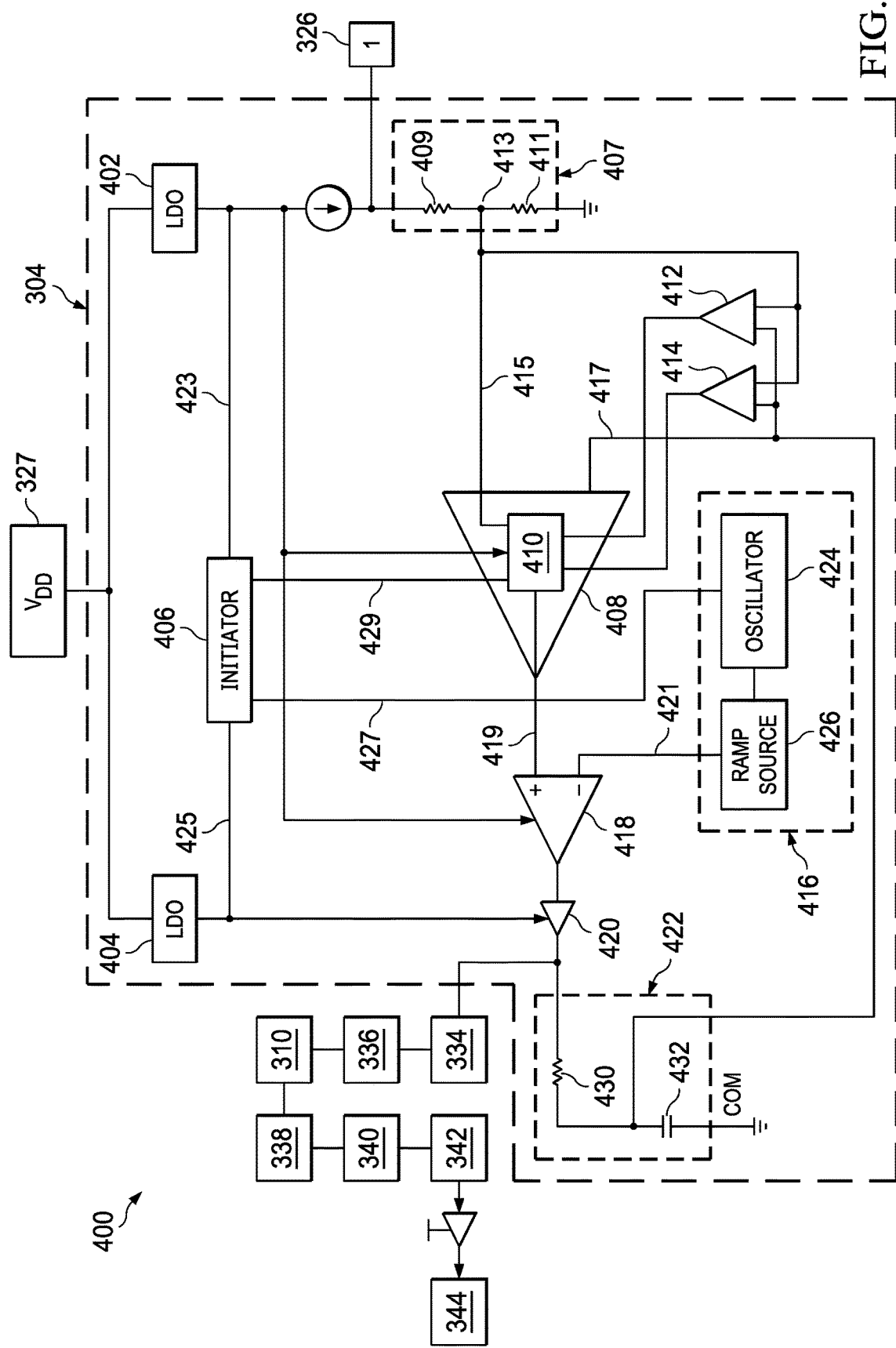
FIG. 4 is a schematic illustration of the example converter of FIG. 3, including various components to improve the startup time and/or reduce overshoot resulting from frequency compensation.

FIG. 4 is a schematic illustration 400 of the example converter 304 of FIG. 3 including various components to improve the startup time and/or reduce overshoot resulting from frequency compensation. The example converter 304 is coupled to the IC pin 326 to obtain an analog signal corresponding to the temperature of the switch 312 of FIG. 3. Additionally, the converter 304 is coupled to the fault encoder IC 334 of FIG. 3. In the illustrated example of FIG. 4, the converter 304 includes an example first low-dropout regulator 402, an example second low-dropout regulator 404, an example initiator 406, an example error amplifier 408, an example compensator 410, an example first threshold comparator 412, an example second threshold comparator 414, an example ramp generator 416, an example ramp comparator 418, an example level shifter 420, and an example filter 422.

In the illustrated example of FIG. 4, the voltage at the IC pin 327 is utilized by the converter 304 of FIG. 3 and FIG. 4. In such examples, the voltage at the IC pin 327 is applied in the converter 304 to the first low-dropout regulator 402 and the second low-dropout regulator 404 to supply power to various electrical components in the converter 304.

In the illustrated example of FIG. 4, the first low-dropout regulator 402 ensures the voltage supplied to the corresponding circuit (e.g., the error amplifier 408 and the ramp comparator 418) is constant. For example, the input of the first low-dropout regulator 402 (e.g., the voltage at the IC pin 327) may be 5.5 volts, and the output of the first low-dropout regulator 402 (e.g., the voltage to power the error amplifier 408 and the ramp comparator 418) is 5.1 volts. In other examples disclosed herein, the output of the first low-dropout regulator 402 (e.g., the voltage to power the error amplifier 408 and the ramp comparator 418) may be any numerical voltage.

In the illustrated example of FIG. 4, the second low-dropout regulator 404 ensures the voltage supplied to the corresponding circuit (e.g., the level shifter 420) is constant. For example, the input of the second low-dropout regulator 404 (e.g., the voltage at the IC pin 327) may be 5.5 volts, and the output of the second low-dropout regulator 404 (e.g., the voltage to power the level shifter 420) is 3.3 volts. In other examples disclosed herein, the output of the second low-dropout regulator 404 (e.g., the voltage to power the level shifter 420) may be any numerical voltage.

In FIG. 4, the example initiator 406 monitors the example first output of the first low-dropout regulator 402 (line 423), the example second output of the second low-dropout regulator 404 (line 425) and the example clock input (line 427). Additionally, the initiator 406 is coupled to the error amplifier 408. In examples disclosed herein, the initiator 406 generates a trigger signal (line 429) in response to observing the first output of the first low-dropout regulator 402 (line 423) reach steady state (e.g., steady 5.1 volts), the second output of the second low-dropout regulator 404 (line 425) reach steady state (e.g., steady 3.3 volts), and the clock input (line 427) reach steady state (e.g., steady 600 kilohertz). In such examples, the determination of whether the first output of the first low-dropout regulator 402 (line 423), the second output of the second low-dropout regulator 404 (line 425)

and/or the clock input (line 427) reach steady state occurs when the corresponding signal no longer experiences transients.

In FIG. 4, an example voltage divider 407 obtains the analog signal corresponding to the temperature of the switch 312 of FIG. 3. The voltage divider 407 utilizes a series of resistive elements (e.g., resistors) to generate a proportional analog signal representative of the temperature of the switch 312 of FIG. 3. In FIG. 4, the voltage divider includes a first series resistor 409 and a second series resistor 411. The output of the voltage divider is the analog sense signal (line 415) realized at node 413.

In the illustrated example of FIG. 4, the error amplifier 408 compares the sense signal (line 415) with the example feedback signal (line 417). In such examples, the error amplifier 408 generates an error output (line 419) including a duty cycle dependent on the voltage difference between the sense signal (line 415) and the feedback signal (line 417).

In the illustrated example of FIG. 4, in order to filter unwanted inductive noise and/or ringing (e.g., inductive noise and/or ringing that affects the converter 304), a compensation capacitor is included at and/or across a compensation node in the error amplifier 408. In examples disclosed herein, the compensation capacitor is included in the example compensator 410. The compensation capacitor is discussed in further detail in FIG. 5.

In FIG. 4, the compensator 410 is included in the error amplifier 408 and is coupled to the initiator 406, the first threshold comparator 412, the second threshold comparator 414, the voltage divider 407, and the filter 422. The compensator 410 provides frequency compensation for the error amplifier 408 and, furthermore, for the converter 304 of FIGS. 3 and 4 and the gate driver IC 302 of FIG. 3. In examples disclosed herein, frequency compensation is performed using a compensation capacitor to set a dominant pole of the converter 304 of FIG. 3. The compensator 410 charges and discharges individual terminals of the compensation capacitor in response to various trigger values obtained (e.g., various operating thresholds met) from at least the initiator 406, the first threshold comparator 412 and/or the second threshold comparator 414. The various trigger values (e.g., various operating threshold) and corresponding action is discussed further in FIG. 5.

In the illustrated example of FIG. 4, the example first threshold comparator 412 is coupled to the filter 422, the error amplifier 408, and the compensator 410. The first threshold comparator 412 compares the feedback signal (line 417) with the sense signal (line 415) from the voltage divider 407. In examples disclosed herein, if the feedback signal (line 417) includes a magnitude at least 50% of the magnitude of the sense signal (line 415) from the voltage divider 407, then the first threshold comparator 412 outputs an example first trigger to the compensator 410. In other examples disclosed herein, the first threshold comparator 412 may output the first trigger to the compensator 410 if the feedback signal (line 417) differs from the sense signal (line 415) from the voltage divider 407 by any predetermined amount (e.g., 20% different, 70% different, etc.).

In the illustrated example of FIG. 4, the example second threshold comparator 414 is coupled to the filter 422, the error amplifier 408, and the compensator 410. The second threshold comparator 414 compares the feedback signal (line 417) with the sense signal (line 415) from the voltage divider 407. In examples disclosed herein, if the feedback signal (line 417) includes a magnitude at least 90% of the magnitude of the sense signal (line 415) from the voltage divider 407, then the second threshold comparator 414 outputs an example second trigger to the compensator 410. In other examples disclosed herein, the second threshold comparator 414 may output the second trigger to the compensator 410 if the feedback signal (line 417) differs from the sense signal (line 415) from the voltage divider 407 by any predetermined amount (e.g., 65% different, 95% different, etc.).

In FIG. 4, the example ramp generator 416 is coupled to the ramp comparator 418. The ramp generator 416 includes the example oscillator 424 and the example ramp source 426. The ramp generator 416 generates a ramp signal (line 421) for use by the ramp comparator 418. In examples disclosed herein, the oscillator 424 governs the frequency for the ramp source 426. The ramp source 426 outputs a ramp signal (line 421) at a desired frequency. In examples disclosed herein, the desired frequency of the ramp signal (line 421) is 600 kilohertz; however, in other examples disclosed herein, the desired frequency may be any suitable frequency for operation (e.g., 300 kilohertz, 450 kilohertz, etc.).

In the illustrated example of FIG. 4, the example ramp comparator 418 is coupled to the output of the error amplifier 408 (e.g., the error output (line 419)), the ramp generator 416 (e.g., the ramp signal (line 421)), and the example level shifter 420. The ramp comparator 418 compares the error output (line 419) with the generated ramp signal (line 421). Depending on where the error output (line 419) aligns with the ramp signal (line 421), the ramp comparator 418 will generate varying outputs. In examples disclosed herein, the duty cycle of the output of the ramp comparator 418 varies corresponding to the alignment of the error output (line 419) and the ramp signal (line 421).

In the illustrated example in FIG. 4, the example level shifter 420 is coupled to the ramp comparator 418 and the example filter 422. In FIG. 4, the level shifter 420 shifts the incoming signal from the ramp comparator 418 to a higher voltage for the output signal of the level shifter 420. In other examples disclosed herein, the level shifter 420 may shift the voltage of the incoming signal from the ramp comparator 418 to a lower voltage for the output signal of the level shifter 420.

In the illustrated example in FIG. 4, the example filter 422 is coupled to the level shifter 420 and to the error amplifier 408. In FIG. 4, the filter 422 includes a filtering resistor 430 and a filtering capacitor 432. The topology illustrated in FIG. 4 includes the filter 422 to act as a low-pass filter. In other examples disclosed herein, the filter 422 may be implemented as a high-pass filter, a bandpass filter, a band-reject filter, or any suitable filter. The output of the filter 422 is the feedback signal (line 417), coupled to the error amplifier 408.

In FIG. 4, the output of the example level shifter 420 is a direct current signal representative of the temperature of the coupled switch 312 of FIG. 3. In such examples, the duty cycle of the output of the level shifter 420 is adjusted by the ramp comparator 418 in response to the example error output (line 419) varying from the generated ramp signal (line 421).

Figure 5:
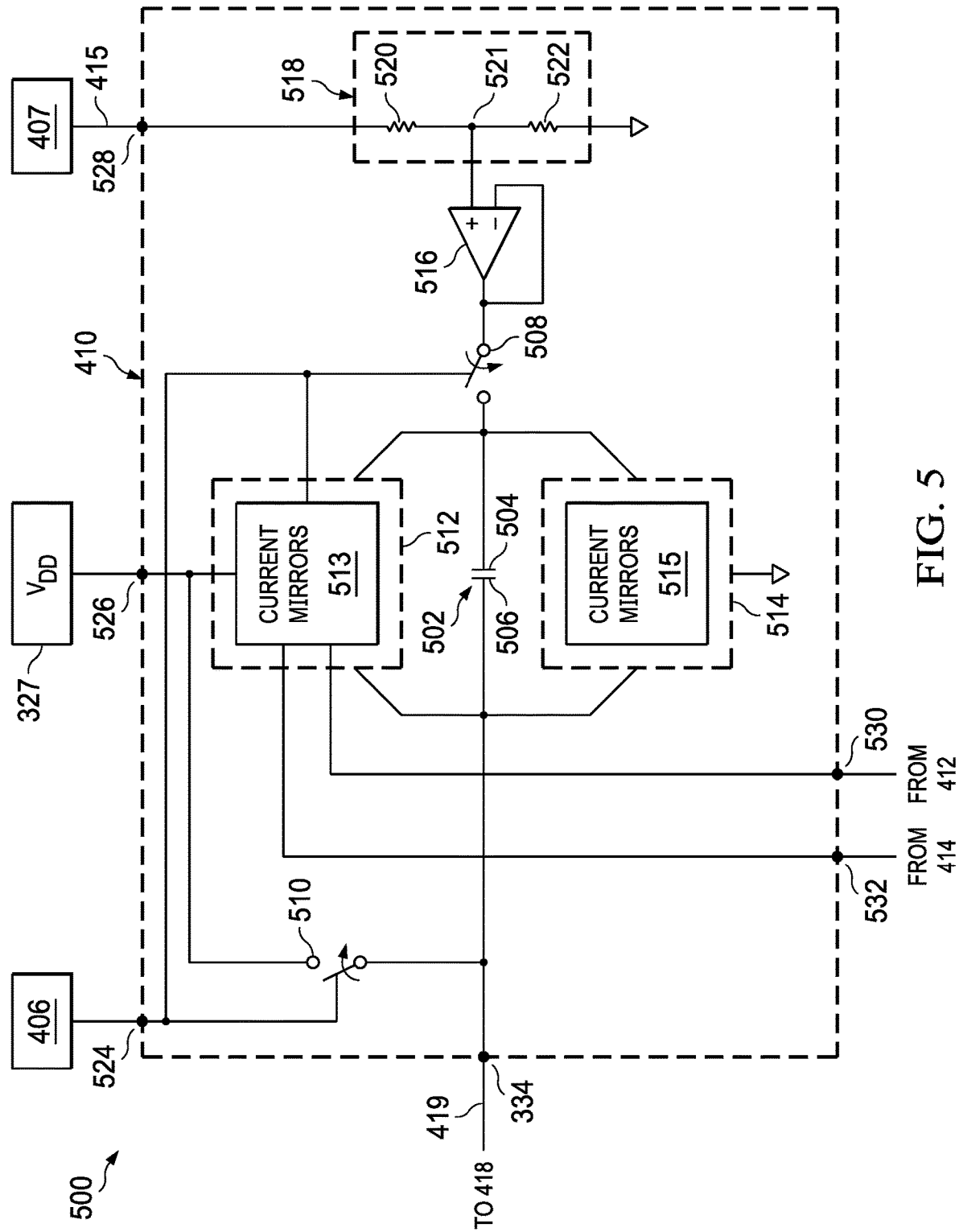
FIG. 5 is a schematic illustration of the example compensator of FIG. 4 to improve the switching characteristics of the gate driver IC of FIG. 3 and the converter of FIGS. 3 and 4.

FIG. 5 is a schematic illustration 500 of the compensator 410 of FIG. 4 to improve the switching characteristics of the gate driver IC 302 of FIG. 3 and the converter 304 of FIGS. 3 and 4. The compensator 410 includes an example compensation capacitor 502 including an example first terminal 504 and an example second terminal 506, an example first switch 508, an example second switch 510, an example variable multiplier 512, an example multiplier 514, an example buffer 516, and an example voltage divider 518 including an example first resistor 520 and an example second resistor 522. The compensator capacitor 502 is coupled to the IC pin 327 (e.g., indirectly through the first low-dropout regulator 402 of FIG. 4), the initiator 406, the voltage divider 407 of FIG. 4, the first threshold comparator 412 of FIG. 4, the second threshold comparator 414 of FIG. 4, and the ramp comparator 418 of FIG. 4.

In examples disclosed herein, the first switch 508 and the second switch 510 are coupled to an example first output connector 524 to obtain an indication of whether to conduct or not conduct. In examples disclosed herein, the indication is generated by the coupled initiator 406 in response to determining that the corresponding voltage and clock signals (e.g., the first output of the first low-dropout regulator (line 423), the second output of the second low-dropout regulator (line 425), and the ramp signal (line 421)) are in steady state. Additionally, the second switch 510 and the variable multiplier 512 are coupled to an example second output connector 526 to obtain the voltage potential at the IC pin 327.

In the example illustrated in FIG. 5, the voltage divider 518 is coupled to an example third output connector 528 to obtain the voltage potential of the sense signal (line 415) of FIG. 4 from the voltage divider 407 of FIG. 4. The variable multiplier 512 is coupled to an example fourth output connector 530 and an example fifth output connector 532 to obtain the first trigger from the first threshold comparator 412 and the second trigger from the second threshold comparator 414, respectively. The second terminal 506 is coupled to an example sixth output connector 534 to provide the adjusted output of the compensator 410 (e.g., the error output 419 of FIG. 4). Examples disclosed herein include modifying the operation of the variable multiplier 512 to indirectly improve the switching conditions of the converter 304 of FIGS. 3 and 4 (e.g., improving the startup time, settling time, and total overshoot of the compensator 410 which dominants the startup time, settling time, and total overshoot of the converter 304 of FIGS. 3 and 4).

In the illustrated example of FIG. 5, the compensation capacitor 502 includes a first terminal 504 and a second terminal 506. The first terminal 504 is coupled to the first switch 508. Additionally, the second terminal 506 is coupled to the second switch 510.

The example compensation capacitor 502 is physically a small capacitor (e.g., 10 picofarads) with respect to the capacitance seen by the circuit (e.g., 400 picofarads). The compensation capacitor 502 is coupled to the variable multiplier 512 and to the multiplier 514. In examples disclosed herein, the variable multiplier 512 and the multiplier 514 are utilized to ensure a physically small compensation capacitor 502 (e.g., 10 picofarads) is utilized to save space in the error amplifier 408 and to include the electrical characteristics (e.g., electrical field capacity, conduciveness, etc.) of a large capacitor (e.g., 400 picofarads). The operation of the variable multiplier 512 and the multiplier 514 will be explained in further detail below and in FIG. 6.

In the illustrated example of FIG. 5, the first switch 508 is illustrated as a two-terminal single-pole switch. In other examples disclosed herein, the first switch 508 may be implemented as a metal-oxide semiconductor field-effect transistor (MOSFET), an isolated gate bipolar transistor (IGBT), or any controllable switching device.

In FIG. 5, the second switch 510 is illustrated as a two-terminal single-pole switch. In other examples disclosed herein, the second switch 510 may be implemented as a metal-oxide semiconductor field-effect transistor (MOSFET), an isolated gate bipolar transistor (IGBT), or any controllable switching device.

In the illustrated example of FIG. 5, the variable multiplier 512 is coupled to the first terminal 504 and the second terminal 506 of the compensation capacitor 502. The variable multiplier 512 includes the example current mirrors 513. In examples disclosed herein, the current mirrors 513 may include any number of current mirrors (e.g., current mirror branches (K), current mirror ratio and, thus, current mirror current gain). In examples disclosed herein, branches of current mirrors 513 are adjusted (e.g., turned on and/or off) by the variable multiplier 512 in response to various triggers from the first threshold comparator 412 of FIG. 4 and/or the second threshold comparator 414 of FIG. 4. Additionally, the variable multiplier 512 is coupled to the IC pin 327 (e.g., indirectly through the first low-dropout regulator 402 of FIG. 4), to the first threshold comparator 412, to the second threshold comparator 414, and to the initiator 406. Examples disclosed herein include obtaining an initial trigger from the initiator 406 to indicate to the variable multiplier 512 to adjust the number of current mirror branches (K) to a first ratio. Examples disclosed herein include utilizing a predetermined number of current mirror branches (K) in which the predetermined number of current mirror branches (K) can be turned on and/or off with respect to the initial trigger from the initiator 406.

In examples disclosed herein, the initial trigger sent by the initiator 406 indicates to the variable multiplier 512 to adjust the capacitive multiplication to a first ratio. In some examples disclosed herein, the first ratio occurs when the number of active current mirror branches (K) is 16. In other examples disclosed herein, the first ratio of active current mirror branches (K) may be any numerical ratio. In such examples, the initial trigger places the compensator 410 in a first state, pre-charge mode.

In examples disclosed herein, the first trigger sent by the first threshold comparator 412 indicates to the variable multiplier 512 to adjust the capacitive multiplication of the variable multiplier 512 (e.g., adjust the active branches in the current mirrors 513) to a second ratio. Examples disclosed herein include utilizing a predetermined number of current mirror branches (K) in which the predetermined number of current mirror branches (K) can be turned on and/or off with respect to the first trigger from the first threshold compensator 412. For example, if the first threshold compensator 412 outputs the first trigger, then the variable multiplier 512 adjusts the predetermined number of current mirror branches (K) to be a lower ratio (e.g., if (K) is 16, then the second ratio is adjusted to include a (K) of 8). In other examples disclosed herein, the variable multiplier 512 may be implemented using any other suitable method and/or apparatus of variable capacitance multiplication (e.g., autotransformer based, operational amplifier based, etc.). In such examples, the first trigger places the compensator 410 in a second state, fast charge mode.

Likewise, if the second threshold comparator 414 outputs the second trigger, then the variable multiplier 512 adjusts the predetermined number of current mirror branches (K) to a third ratio. In examples disclosed herein, the third ratio is higher than the first ratio (e.g., if (K) is 16, then the third ratio is adjusted to include a (K) of 24). In such examples, the second trigger places the compensator 410 in a third state, slow charge mode.

In such examples, the variable multiplier 512 strength is modulated in response to the various triggers sent by at least the first threshold comparator 412 and/or the second threshold comparator 414.

In the illustrated example of FIG. 5, the multiplier 514 is coupled to the first terminal 504 and the second terminal 506 of the compensation capacitor 502. Additionally, the multiplier 514 is coupled to the IC pin 327 (e.g., indirectly through the variable multiplier 512). Examples disclosed herein include utilizing a second predetermined number of current mirrors 515 to achieve the desired capacitance multiplication. In such examples, the second predetermined number of current mirrors 515 is constant and, thus, the desired capacitance multiplication ratio of the multiplier 514 is constant. In other examples disclosed herein, the multiplier 514 may be a variable multiplier (e.g., similar to the variable multiplier 512). In other examples disclosed herein, the multiplier 514 may be implemented using any other suitable method and/or apparatus of capacitance multiplication (e.g., autotransformer based, operational amplifier based, etc.).

In the illustrated example of FIG. 5, the example buffer 516 includes an output terminal coupled to the first switch 508 and an input terminal coupled to the voltage divider 518. The buffer 516 acts as a voltage follower to provide the voltage on the input (e.g., the voltage potential at node 521) to the output (e.g., to the first switch 508). In examples disclosed herein, the buffer 516 may be used to transfer the input voltage (e.g., the voltage potential at node 521) from a first impedance to a second impedance. In such examples the first impedance is greater than the second impedance.

In the illustrated example of FIG. 5, the example voltage divider 518 is coupled to the voltage divider 407 of FIG. 4. In other examples disclosed herein, the voltage divider 518 and the voltage divider 407 of FIG. 4 may be implemented as a single voltage divider. In FIG. 5, the voltage divider 518 includes a first resistor 520 coupled in series with a second resistor 522. The first resistor 520 and the second resistor 522 share a common node, node 521. In FIG. 5, node 521 includes a voltage potential proportional to the voltage potential corresponding to the output of the voltage divider 407 of FIG. 4. In FIG. 5, the first resistor 520 and the second resistor 522 may be any suitable resistance value and, in fact, may be any suitable resistive element (e.g., a load).

Figure 6:
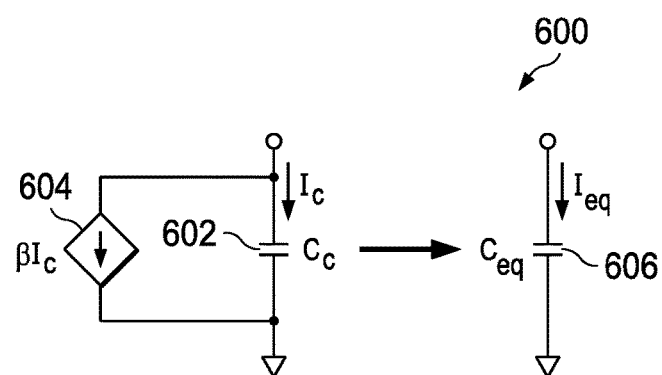
FIG. 6 is a schematic illustration of an example multiplier associated with the current mirrors of FIG. 5, to adjust the effective capacitance of a capacitor.

FIG. 6 is a schematic illustration 600 of example multiplier, associated with the variable multiplier 512 and the multiplier 514 of FIG. 5, to adjust the effective capacitance of a capacitor. In examples disclosed herein, the theory of capacitance multiplication is governed by at least the following two equations.

$$I_{eq} = \beta * I_C + I_C \quad \text{Equation 1}$$

$$C_{eq} = (1+\beta) * C_C \quad \text{Equation 2}$$

In equation 1, the variable (β) is the current gain of the current mirrors 513 used in association with the variable multiplier 512 and/or the multiplier 514 of FIG. 5, $I_c$ is the current through the capacitor 602, and $I_{eq}$ is the equivalent current of the equivalent capacitor 606. The current gain of the current mirrors 513 (β) times the current through the capacitor 602 represents an effective multiplication current 604.

In equation 2, the variable (β) is the current gain of the current mirrors 513 used in association with the variable multiplier 512 and/or the multiplier 514 of FIG. 5, the variable $C_C$ is the capacitance, in farads, of the capacitor 602, and $C_{eq}$ is the effective equivalent capacitance of the equivalent capacitor 606.

In the illustrated examples of FIG. 6, a multiplication factor of capacitance (e.g., the variable $C_{eq}$) is achieved using the current gain (β) of the current mirrors 513 used in association with the variable multiplier 512 and/or the multiplier 514 of FIG. 5. In other examples disclosed herein, any suitable method of capacitive multiplication may be used and, in fact, any suitable method of generating the current gain (β) may be used (e.g., operational amplifier gain, etc.).

Figure 7:
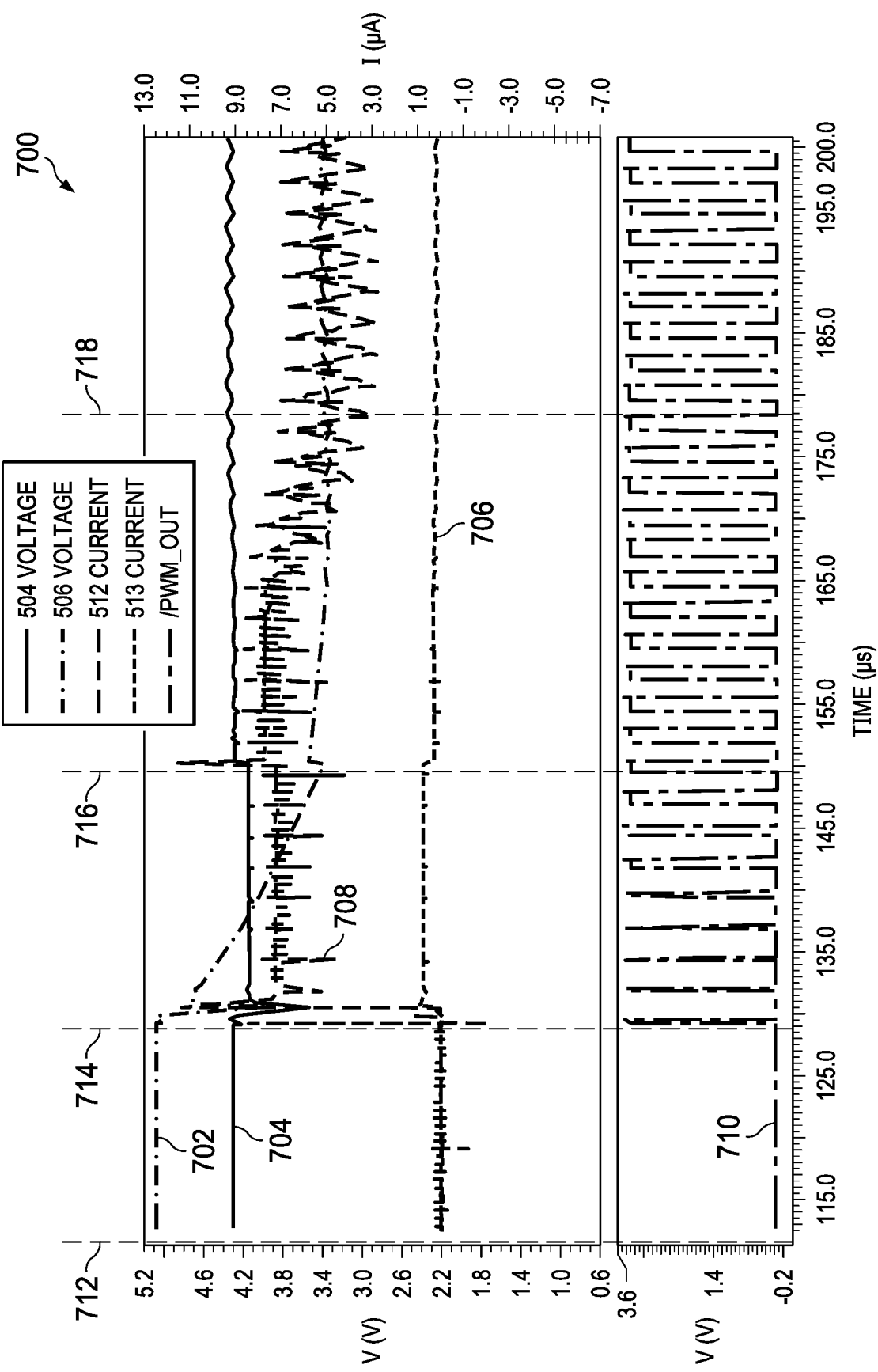
FIG. 7 is a graphical illustration of various compensation capacitor voltages and currents versus time in the example compensator of FIGS. 4 and 5.

FIG. 7 is a graphical illustration 700 of various compensation capacitor voltages and currents versus time in the example compensator 410 of FIGS. 4 and 5. In FIG. 7, the voltage at the second terminal 506 of the compensation capacitor 502 of FIG. 5 is depicted as line 702. The voltage at the first terminal 504 of the compensation capacitor 502 of FIG. 5 is depicted as line 704. The current through the current mirrors 513 of FIG. 5 is depicted as line 706. The current through the variable multiplier 512 of FIG. 5 is depicted as line 708. The voltage output of the converter 304 of FIG. 3 is depicted as line 710. In examples disclosed herein, the voltage output of the converter 304 (line 710) is respondent to the voltage at the first terminal 504 of the compensation capacitor 502 (line 704) and/or the voltage at the second terminal 506 of the compensation capacitor 502 (line 702).

In the example illustration of FIG. 7, during the example first time interval 712 and the example second time interval 714, the compensator 410 is in the pre-charge mode (e.g., the compensator 410 of FIGS. 4 and 5 is awaiting a trigger from the initiator). In such illustration, the first terminal 504 of FIG. 5 is charged to the first threshold voltage (e.g., the voltage at the first terminal 504 (line 704) is 4.3 volts) and the second terminal 506 of FIG. 5 is charged to the second threshold voltage (e.g., the voltage at the second terminal 506 (line 702) is 5.1 volts). In examples disclosed herein, the first threshold voltage is less than the second threshold voltage.

In the example illustration of FIG. 7, at the second time interval 714, the initiator 406 of FIG. 4 sends a trigger to the compensator 410 of FIGS. 4 and 5 indicating that the corresponding voltages (e.g., the voltage at the first terminal 504 (line 704) and the voltage at the second terminal 506 (line 706)) and the clock signal (e.g., the ramp signal (line 421 of FIG. 4)) are in a steady state condition. During the second time interval 714 and the example third time interval 716, the compensator 410 of FIGS. 4 and 5 is in fast charge mode. As such, the number of active current mirror branches (K) in the current mirrors 513 of the variable multiplier 512 of FIG. 5 is decreased to include a current mirror 513 ratio of 8 (e.g., the number of active current mirror branches (K) is decreased to 8)). In response, the effective capacitance of the compensation capacitor 502 is adjusted proportionally and, therefore, the voltage at the second terminal 506 (line 702) settles quickly (e.g., 20 microseconds). In other examples disclosed herein, during the fast charge mode between the second time interval 714 and the third time interval 716, the number of active current mirror branches (K) in the current mirrors 513 in the variable multiplier 512 of FIG. 5 can be decreased to include any numerical current mirror ratio that is below the normal operation ratio. For example, if the normal operation ratio is 16 (e.g., the number of active current mirrors (K) is 16), during the fast charge mode the ratio can be decreased to any numerical value less than 16.

In the example illustration of FIG. 7, at the third time interval 716, the first threshold comparator 412 of FIG. 4 sends a first trigger to the compensator 410 of FIGS. 4 and 5 indicating the feedback signal (line 417) of FIG. 4 is 50% of the sense signal (line 415) of FIG. 4. In other examples disclosed herein, the first threshold comparator 412 of FIG. 4 may send the first trigger in response to determining the feedback signal (line 417) of FIG. 4 is any numerical percentage difference from the sense signal (line 415) of FIG. 4 (e.g., 40%, 65%, etc.). During the third time interval 716 and the example fourth time interval 718, the compensator 410 of FIGS. 4 and 5 is in slow charge mode. As such, the number of active current mirror branches (K) in the current mirrors 513 of the variable multiplier 512 of FIG. 5 is increased to include a current mirror 513 ratio of 24 (e.g., the number of active current mirror branches (K) is increased to 24)). In response, the effective capacitance of the compensation capacitor 502 is adjusted proportionally and, therefore, the voltage at the second terminal 506 (line 702) settles slowly (e.g., 30 microseconds). In other examples disclosed herein, during the slow charge mode between the third time interval 716 and the fourth time interval 718, the number of active current mirror branches (K) in the current mirrors 513 of the variable multiplier 512 of FIG. 5 can be increased to include any numerical current mirror ratio that is above the normal operation ratio. For example, if the normal operation ratio is 16 (e.g., the number of active current mirror branches (K) is 16), during the slow charge mode the ratio can be increased to any numerical value greater than 16.

In the example illustration of FIG. 7, at the fourth time interval 718, the second threshold comparator 414 of FIG. 4 sends a second trigger to the compensator 410 of FIGS. 4 and 5 indicating the feedback signal (line 417) of FIG. 4 is 90% of the sense signal (line 415) of FIG. 4. In other examples disclosed herein, the second threshold comparator 414 of FIG. 4 may send the second trigger in response to determining the feedback signal (line 417) of FIG. 4 is any numerical percentage difference from the sense signal (line 415) of FIG. 4 (e.g., 95%, 85%, etc.). After the fourth time interval 718, the compensator 410 of FIGS. 4 and 5 returns to normal operating mode. As such, the number of active current mirror branches (K) in the current mirrors 513 of the variable multiplier 512 of FIG. 5 includes the normal operating ratio of current mirrors (e.g., the number of active current mirror branches (K)). Clearly depicted in FIG. 7, the startup time (e.g., settling time) of the output of the converter 304 (line 710) is less than 60 microseconds.

Figure 8:
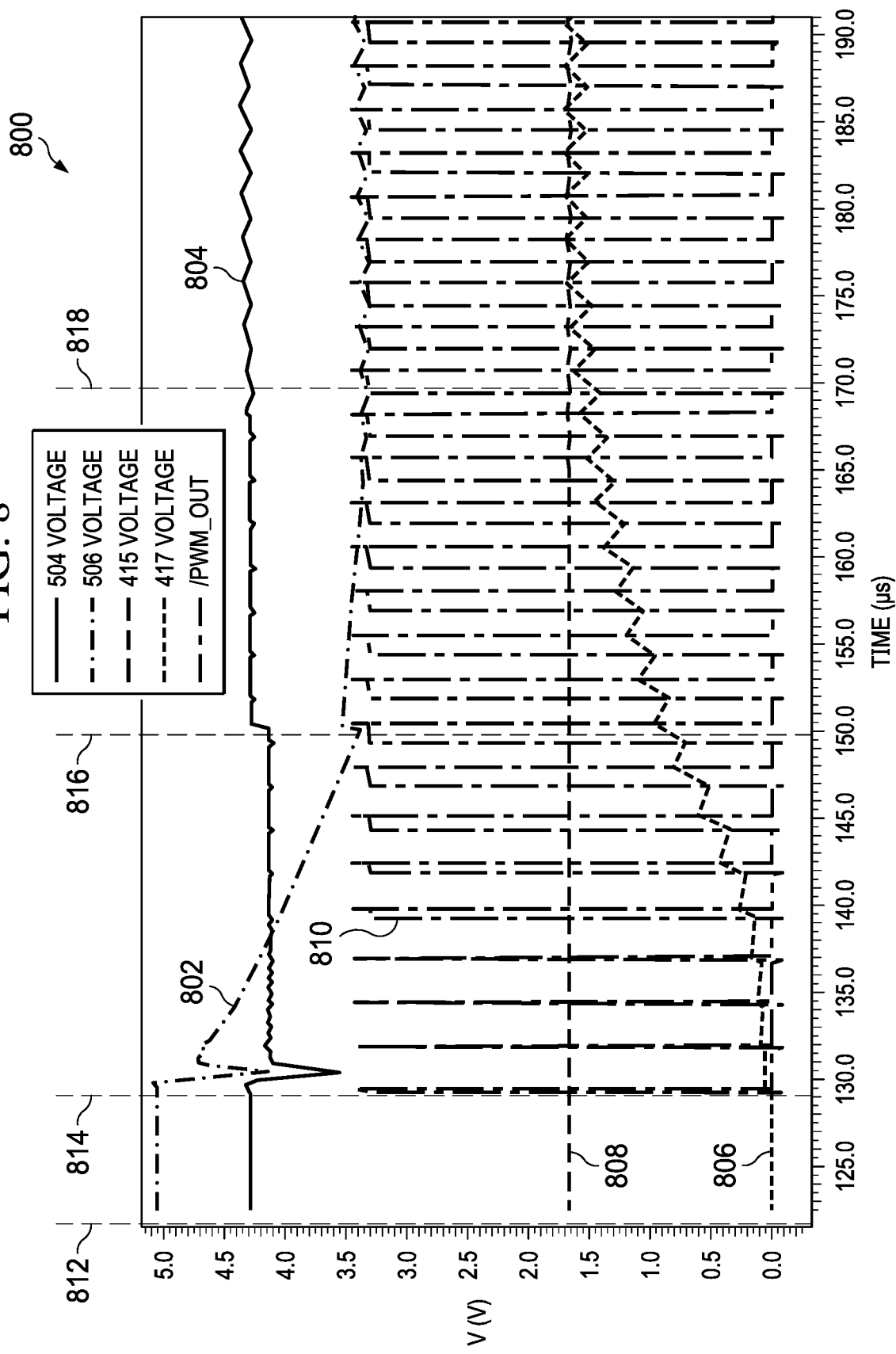
FIG. 8 is a graphical illustration of additional various compensator voltages and currents versus time in the example compensator of FIGS. 4 and 5.

FIG. 8 is a graphical illustration 800 of additional various compensator voltages and currents versus time in the compensator 410 of FIGS. 4 and 5. In FIG. 8, the voltage at the second terminal 506 of the compensation capacitor 502 of FIG. 5 is depicted as line 802. The voltage at the first terminal 504 of the compensation capacitor 502 of FIG. 5 is depicted as line 804. The voltage potential of the feedback signal (line 417) of FIG. 4 is depicted as line 806. The voltage potential of the sense signal (line 415) of FIG. 4 is depicted as line 808. The voltage output of the converter 304 of FIG. 3 is depicted as line 810. In examples disclosed herein, the voltage output of the converter 304 (line 810) is respondent to the voltage at the first terminal 504 of the compensation capacitor 502 (line 804) and/or the voltage at the second terminal 506 of the compensation capacitor 502 (line 802).

In the example illustration of FIG. 8, during the example first time interval 812 and the example second time interval 814, the compensator 410 is in pre-charge mode (e.g., the compensator 410 of FIGS. 4 and 5 is awaiting a trigger from the initiator). In such illustration, the first terminal 504 of FIG. 5 is charged to the first threshold voltage (e.g., the voltage at the first terminal 504 (line 804) is 4.3 volts) and the second terminal 506 of FIG. 5 is charged to the second threshold voltage (e.g., the voltage at the second terminal 506 (line 802) is 5.1 volts). In examples disclosed herein, the first threshold voltage is less than the second threshold voltage.

In the example illustration of FIG. 8, at the second time interval 814, the initiator 406 of FIG. 4 sends a trigger to the compensator 410 of FIGS. 4 and 5 indicating that the corresponding voltages (e.g., the voltage at the first terminal 504 (line 804) and the voltage at the second terminal 506 (line 706)) and the clock signal (e.g., the ramp signal (line 421 of FIG. 4)) are in steady state. During the second time interval 814 and the example third time interval 816, the compensator 410 of FIGS. 4 and 5 is in fast charge mode. As such, the ratio of the variable multiplier 512 of FIG. 5 is decreased to include a current mirror 513 ratio of 8 (e.g., the number of active current mirror branches (K) is decreased to 8)). In response, the effective capacitance of the compensation capacitor 502 is adjusted proportionally and, therefore, the voltage at the second terminal 506 (line 802) settles quickly (e.g., 20 microseconds). In other examples disclosed herein, during the fast charge mode between the second time interval 814 and the third time interval 816, the number of active current mirror branches (K) in the current mirrors 513 of the variable multiplier 512 of FIG. 5 can be decreased to include any numerical current mirror ratio that is below the normal operation ratio. For example, if the normal operation ratio is 16 (e.g., the number of active current mirror branches (K) is 16), during the fast charge mode the ratio can be decreased to any numerical value less than 16.

In the example illustration of FIG. 8, at the third time interval 816, the first threshold comparator 412 of FIG. 4 sends a first trigger to the compensator 410 of FIGS. 4 and 5 indicating the feedback signal (line 417) of FIG. 4 (line 806) is 50% of the sense signal (line 415) of FIG. (line 808). In other examples disclosed herein, the first threshold comparator 412 of FIG. 4 may send the first trigger in response to determining the feedback signal (line 417) of FIG. 4 is any numerical percentage difference from the sense signal (line 415) of FIG. 4 (e.g., 40%, 65%, etc.). During the third time interval 816 and the example fourth time interval 818, the compensator 410 of FIGS. 4 and 5 is in slow charge mode. As such, the number of active current mirror branches (K) in the current mirrors 513 of the variable multiplier 512 of FIG. 5 is increased to include a current mirror 513 ratio of 24 (e.g., the number of active current mirror branches (K) is increased to 24)). In response, the effective capacitance of the compensation capacitor 502 is adjusted proportionally and, therefore, the voltage at the second terminal 506 (line 806) settles slowly (e.g., 30 microseconds). In other examples disclosed herein, during the slow charge mode between the third time interval 816 and the fourth time interval 818, the ratio of the variable multiplier 512 of FIG. 5 can be increased to include any numerical number of active current mirror branches (K) that is above the normal operation ratio. For example, if the normal operation ratio is 16 (e.g., the number of active current mirror branches (K) is 16), during the slow charge mode the ratio can be increased to any numerical value greater than 16.

In the example illustration of FIG. 8, at the fourth time interval 818, the second threshold comparator 414 of FIG. 4 sends a second trigger to the compensator 410 of FIGS. 4 and 5 indicating the feedback signal (line 417) of FIG. 4 (line 806) is 90% of the sense signal (line 415) of FIG. 4 (line 808). In other examples disclosed herein, the second threshold comparator 414 of FIG. 4 may send the second trigger in response to determining the feedback signal (line 417) of FIG. 4 is any numerical percentage difference from the sense signal (line 415) of FIG. 4 (e.g., 95%, 85%, etc.).

After the fourth time interval 818, the compensator 410 of FIGS. 4 and 5 returns to normal operating mode. As such, the number of active current mirror branches (K) in the current mirrors 513 of the variable multiplier 512 of FIG. 5 is includes the normal operating ratio of current mirrors (e.g., the number of active current mirror branches (K)). Clearly depicted in FIG. 8, the startup time (e.g., settling time) of the output of the converter 304 (line 810) is reduced (e.g., less than 60 microseconds).

Figure 9:
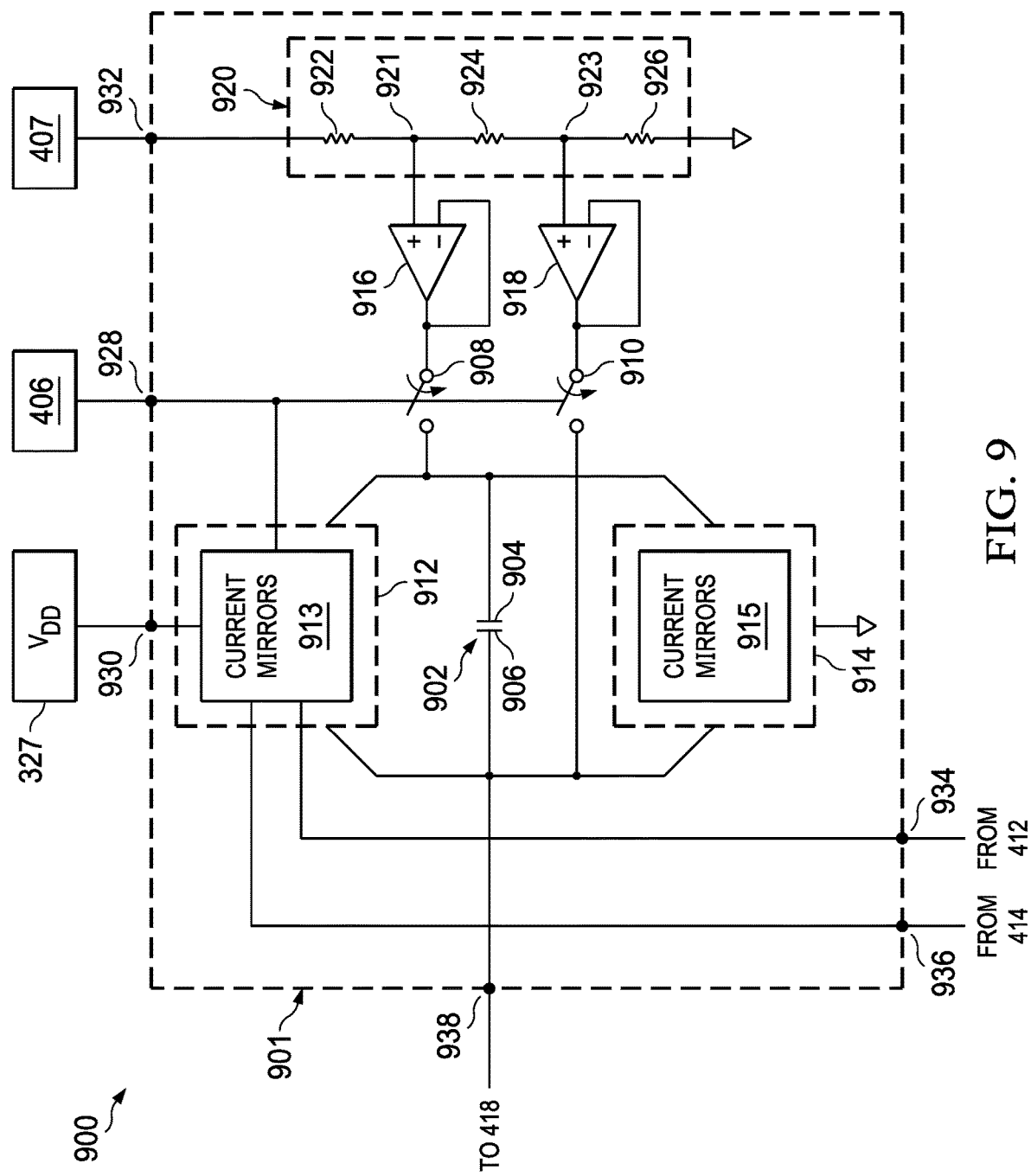
FIG. 9 is a schematic illustration of an additional example compensator including various components to improve the switching characteristics of the gate driver IC of FIG. 3 and the converter of FIGS. 3 and 4.

FIG. 9 is a schematic illustration 900 of an example compensator 901 including various components to improve the switching characteristics of the gate driver IC 302 of FIG. 3 and the converter 304 of FIGS. 3 and 4. The example compensator 901 includes an example compensation capacitor 902 including an example first terminal 904 and an example second terminal 906, an example first switch 908, an example second switch 910, an example variable multiplier 912, an example multiplier 914, an example first buffer 916, an example second buffer 918, and an example voltage divider 920 including an example first resistor 922, an example second resistor 924, and an example third resistor 926. The compensator 901 is coupled to the IC pin 327 (e.g., indirectly through the first low-dropout regulator 402 of FIG. 4), the error amplifier 408, the voltage divider 407 of FIG. 4, the first threshold comparator 412 of FIG. 4, the second threshold comparator 414 of FIG. 4, and the ramp comparator 418 of FIG. 4.

In examples disclosed herein, the first switch 908 and the second switch 910 are coupled to an example first output connector 928 to obtain an indication of whether to conduct or not conduct (e.g., the indication from the initiator 406 of FIG. 4 indicating that the voltage and clock signals are in steady state). Additionally, the variable multiplier 912 is coupled to an example second output connector 930 to obtain the voltage potential originating from the IC pin 327. The voltage divider 920 of FIG. 9 is coupled to an example third output connector 932 to obtain the voltage potential of the sense signal (line 415) of FIG. 4 from the voltage divider 407 of FIG. 4. The variable multiplier 912 is coupled to an example fourth output connector 934 and an example fifth output connector 936 to obtain the first trigger from the first threshold comparator 412 and the second trigger from the second threshold comparator 414, respectively. The second terminal 906 is coupled to an example sixth output connector 938 to provide the adjusted output of the compensator 410 (e.g., the error output 419 of FIG. 4). Examples disclosed herein include modifying the operation of the variable multiplier 912 to indirectly improve the startup time, settling time, and total overshoot of the converter 304 of FIGS. 3 and 4 (e.g., improving the startup time, settling time, and total overshoot of the compensator 410 which dominants the startup time, settling time, and total overshoot of the converter 304 of FIGS. 3 and 4).

In the illustrated example of FIG. 9, the compensation capacitor 902 includes a first terminal 904 and a second terminal 906. The first terminal 904 is coupled to the first switch 908. Additionally, the second terminal 906 is coupled to the second switch 910.

The example compensation capacitor 902 is physically a small capacitor (e.g., 10 picofarads) with respect to the actual capacitance seen by the circuit (e.g., 400 picofarads). The compensation capacitor 902 is coupled to the variable multiplier 912 and to the multiplier 914. In examples disclosed herein, the variable multiplier 912 and the multiplier 914 are utilized to ensure the physically small compensation capacitor 902 (e.g., 10 picofarads) is utilized to save space in the error amplifier 408 and include the electrical characteristics (e.g., electrical field capacity, conduciveness, etc.) of a large capacitor (e.g., 200 picofarads).

In the illustrated example of FIG. 9, the first switch 908 is illustrated as a two-terminal single-pole switch. In other examples disclosed herein, the first switch 908 may be implemented as a metal-oxide semiconductor field-effect transistor (MOSFET), an isolated gate bipolar transistor (IGBT), or any controllable switching device.

In the illustrated example of FIG. 5, the second switch 910 is illustrated as a two-terminal single-pole switch. In other examples disclosed herein, the second switch 910 may be implemented as a metal-oxide semiconductor field-effect transistor (MOSFET), an isolated gate bipolar transistor (IGBT), or any controllable switching device.

In the illustrated example of FIG. 9, the variable multiplier 912 is coupled to the first terminal 904 and the second terminal 906 of the compensation capacitor 902. The variable multiplier 912 includes the example current mirrors 913. In examples disclosed herein, the current mirrors 913 may include any number of current mirrors (e.g., current mirror branches (K), current mirror ratio and, thus, current mirror current gain). In examples disclosed herein, branches of current mirrors 913 are to be adjusted (e.g., turned on and/or off) by the variable multiplier 912 in response to various triggers from the first threshold comparator 412 of FIG. 4 and/or the second threshold comparator 414 of FIG. 4. Additionally, the variable multiplier 912 is coupled to the IC pin 327 (e.g., indirectly through the first low-dropout regulator 402 of FIG. 4), to the first threshold comparator 412, to the second threshold comparator 414, and to the initiator 406. In examples disclosed herein, the first trigger sent by the first threshold comparator 412 indicates to the variable multiplier 912 to adjust the capacitive multiplication of the variable multiplier 912 (e.g., adjust the active branches in the current mirrors 913). Examples disclosed herein include utilizing a predetermined number of current mirror branches (K) in which the predetermined number of current mirror branches (K) can be turned on and/or off with respect to the first trigger from the first threshold compensator 412. For example, if the first threshold compensator 412 outputs the first trigger, then the variable multiplier 912 adjusts the predetermined number of current mirror branches (K) to be a lower ratio (e.g., if (K) is 16, then the ratio is adjusted to include a (K) of 8). In other examples disclosed herein, the variable multiplier 912 may be implemented using any other suitable method and/or apparatus of variable capacitance multiplication (e.g., autotransformer based, operational amplifier based, etc.).

Likewise, if the second threshold comparator 414 outputs the second trigger, then the variable multiplier 912 adjusts the predetermined number of current mirror branches (K) to be a higher ratio (e.g., if (K) is 16, then the ratio is adjusted to include a (K) of 24). In such examples, the variable multiplier 912 strength is modulated in response to the various triggers sent by at least the first threshold comparator 412 and/or the second threshold comparator 414.

In the illustrated example of FIG. 9, the multiplier 914 is coupled to the first terminal 904 and the second terminal 906 of the compensation capacitor 902. Additionally, the multiplier 914 is coupled to the IC pin 327 (e.g., indirectly through the variable multiplier 912). Examples disclosed herein include utilizing a second predetermined number of current mirrors 915 to achieve the desired capacitance multiplication. In such examples, the second predetermined number of current mirrors 915 is constant and, thus, the desired capacitance multiplication ratio is constant. In other examples disclosed herein, the multiplier 914 may be a variable multiplier (e.g., similar to the variable multiplier 912). In other examples disclosed herein, the multiplier 914 may be implemented using any other suitable method and/or apparatus of capacitance multiplication (e.g., autotransformer based, operational amplifier based, etc.).

In the illustrated example of FIG. 9, the example first buffer 916 includes an output terminal coupled to the first switch 908 and an input terminal the voltage divider 920 at node 921. The first buffer 916 acts as a voltage follower to provide the same voltage on the input (e.g., the voltage potential at node 921) to the output (e.g., to the first switch 908). In examples disclosed herein, the first buffer 916 may be used to transfer the input voltage (e.g., the voltage potential at node 921) from a first impedance level to a second impedance level (e.g., the first impedance greater than the second impedance).

In the illustrated example of FIG. 9, the example second buffer 918 includes an output terminal coupled to the second switch 910 and an input terminal coupled to the voltage divider 920 at node 923. The second buffer 918 acts as a voltage follower to provide the same voltage on the input (e.g., the voltage potential at node 923) to the output (e.g., to the second switch 910). In examples disclosed herein, the second buffer 918 may be used to transfer the input voltage (e.g., the voltage potential at node 923) from a first impedance level to a second impedance level (e.g., the first impedance greater than the second impedance).

In the illustrated example of FIG. 9, the example voltage divider 920 is coupled to the voltage divider 407 of FIG. 4. In other examples disclosed herein, the voltage divider 920 and the voltage divider 407 of FIG. 4 may be implemented as a single voltage divider. In FIG. 9, the voltage divider 920 includes a first resistor 922 coupled in series with a second resistor 924. The first resistor 922 and second resistor 924 are further coupled in series with the third resistor 926. The first resistor 922 and the second resistor 924 share a common node, node 921. The second resistor 924 and the third resistor 926 share a common node, node 923. In FIG. 9, node 921 includes a first voltage potential proportional to the voltage potential corresponding to the output of the voltage divider 407 of FIG. 4 and the first resistor 922 and the second resistor 924. Additionally, in FIG. 9, node 923 includes a voltage potential proportional to the voltage potential corresponding to the output of the voltage divider 407 of FIG. 4 and to the first voltage potential at node 921. In the topology illustrated in FIG. 9, the first voltage potential is greater than the second voltage potential and, thus, the second terminal 906 is charged to a lesser voltage potential than the first terminal 904 (e.g., the first terminal 904 is charged to the first voltage potential and the second terminal 906 is charged to the second voltage potential). In FIG. 9, the first resistor 922, the second resistor 924, and/or the third resistor 926 may be any suitable resistance value and, in fact, may be any suitable resistive element (e.g., a load).

Figure 10:
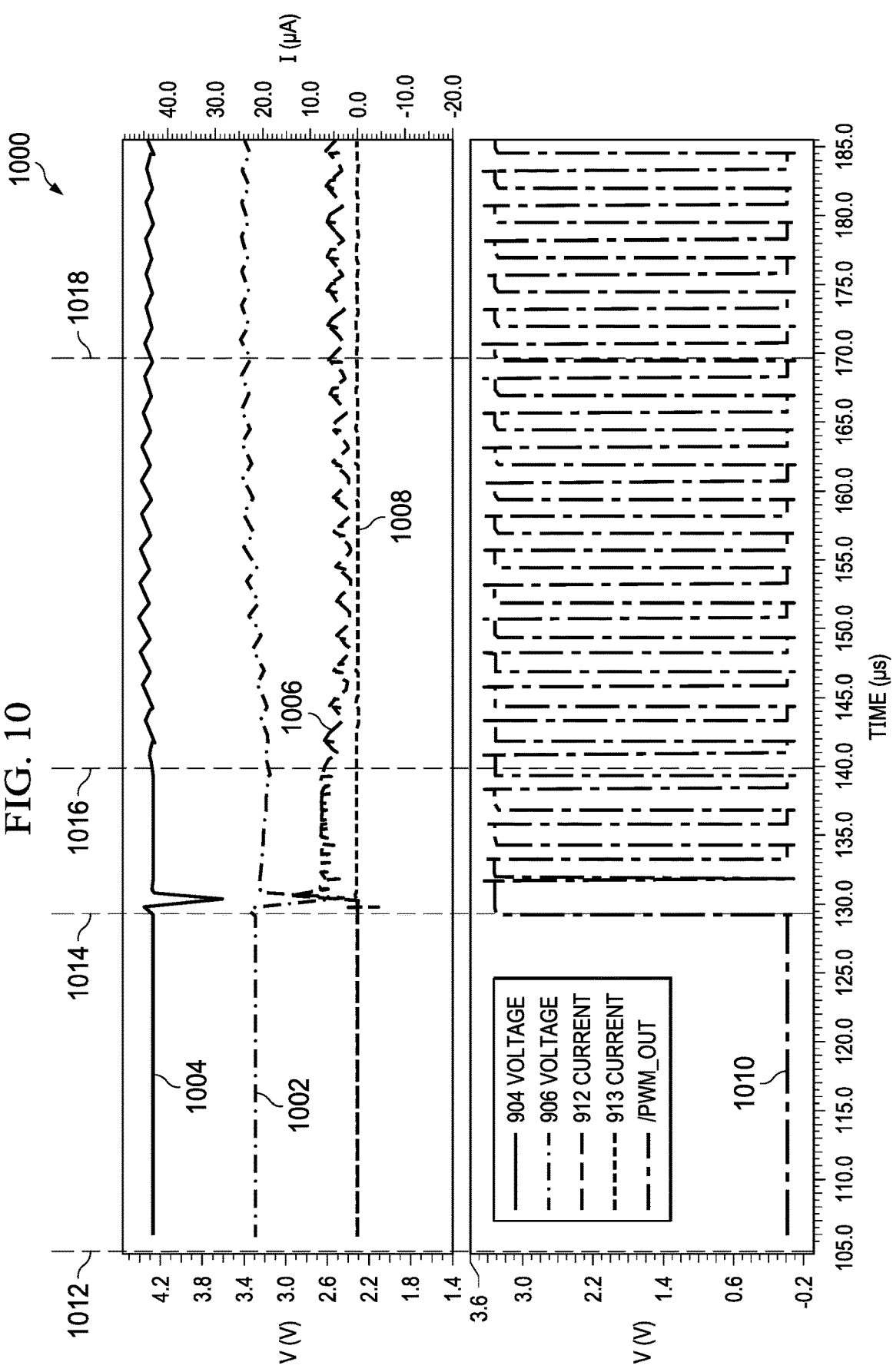
FIG. 10 is a graphical illustration of various compensation capacitor voltages and currents versus time in the example compensator of FIG. 9.

FIG. 10 is a graphical illustration 1000 of various compensation capacitor 902 voltages and currents versus time in the example compensator 901 of FIG. 9. In FIG. 9, the voltage at the second terminal 906 of the compensation capacitor 902 of FIG. 9 is depicted as line 1002. The voltage at the first terminal 904 of the compensation capacitor 902 of FIG. 9 is depicted as line 1004. The current through the current mirrors 913 of FIG. 9 is depicted as line 1006. The current through the variable multiplier 912 of FIG. 9 is depicted as line 1008. The voltage output of the converter 304 of FIG. 3 is depicted as line 1010. In examples disclosed herein, the voltage output of the converter 304 (line 1010) is respondent to the voltage at the first terminal 904 of the compensation capacitor 902 (line 1004) and/or the voltage at the second terminal 906 of the compensation capacitor 902 (line 1002).

In the example illustration of FIG. 10, during the example first time interval 1012 and the example second time interval 1014, the compensator 901 is in the pre-charge mode (e.g., the compensator 901 of FIG. 9 is awaiting a trigger from the initiator). In such illustration, the first terminal 904 of FIG. 9 is charged to the first threshold voltage (e.g., the voltage at the first terminal 904 (line 1004) is 4.3 volts) and the second terminal 906 of FIG. 9 is charged to the second threshold voltage (e.g., the voltage at the second terminal 906 (line 1002) is 3.3 volts). In examples disclosed herein, the first threshold voltage is greater than the second threshold voltage.

In the example illustration of FIG. 10, at the second time interval 1014, the initiator 406 of FIG. 4 sends a trigger to the compensator 901 of FIG. 9 indicating that the corresponding voltages (e.g., the voltage at the first terminal 904 (line 1004) and the voltage at the second terminal 906 (line 1006)) and the clock signal (e.g., the ramp signal (line 421 of FIG. 4)) are in a steady state condition. During the second time interval 1014 and the example third time interval 1016, the compensator 901 of FIG. 9 is in fast charge mode. As such, the number of active current mirror branches (K) in the current mirrors 913 of the variable multiplier 912 of FIG. 9 is decreased to include a current mirror 913 ratio of 8 (e.g., the number of active current mirror branches (K) is decreased to 8)). In response, the effective capacitance of the compensation capacitor 902 is adjusted proportionally and, therefore, the voltage at the second terminal 906 (line 1002) settles quickly (e.g., 11 microseconds). In other examples disclosed herein, during the fast charge mode between the second time interval 1014 and the third time interval 1016, the number of active current mirror branches (K) in the current mirrors 913 in the variable multiplier 912 of FIG. 9 can be decreased to include any numerical current mirror ratio that is below the normal operation ratio. For example, if the normal operation ratio is 16 (e.g., the number of active current mirrors (K) is 16), during the fast charge mode the ratio can be decreased to any numerical value less than 16.

In the example illustration of FIG. 10, at the third time interval 1016, the first threshold comparator 412 of FIG. 4 sends a first trigger to the compensator 901 of FIG. 9 indicating the feedback signal (line 417) of FIG. 4 is 50% of the sense signal (line 415) of FIG. 4. In other examples disclosed herein, the first threshold comparator 412 of FIG. 4 may send the first trigger in response to determining the feedback signal (line 417) of FIG. 4 is any numerical percentage difference from the sense signal (line 415) of FIG. 4 (e.g., 40%, 65%, etc.). During the third time interval 1016 and the example fourth time interval 1018, the compensator 901 of FIG. 9 is in slow charge mode. As such, the number of active current mirror branches (K) in the current mirrors 913 of the variable multiplier 912 of FIG. 9 is increased to include a current mirror 913 ratio of 24 (e.g., the number of active current mirror branches (K) is increased to 24)). In response, the effective capacitance of the compensation capacitor 902 is adjusted proportionally and, therefore, the voltage at the second terminal 906 (line 1002) settles slowly (e.g., 30 microseconds) in comparison to the compensation capacitor 902 discharge rate during the fast charge mode. In other examples disclosed herein, during the slow charge mode between the third time interval 1016 and the fourth time interval 1018, the number of active current mirror branches (K) in the current mirrors 913 of the variable multiplier 912 of FIG. 9 can be increased to include any numerical current mirror ratio that is above the normal operation ratio. For example, if the normal operation ratio is 16 (e.g., the number of active current mirror branches (K) is 16), during the slow charge mode the ratio can be increased to any numerical value greater than 16.

In the example illustration of FIG. 10, at the fourth time interval 1018, the second threshold comparator 414 of FIG. 4 sends a second trigger to the compensator 901 of FIG. 9 indicating the feedback signal (line 417) of FIG. 4 is 90% of the sense signal (line 415) of FIG. 4. In other examples disclosed herein, the second threshold comparator 414 of FIG. 4 may send the second trigger in response to determining the feedback signal (line 417) of FIG. 4 is any numerical percentage difference from the sense signal (line 415) of FIG. 4 (e.g., 95%, 85%, etc.). After the fourth time interval 1018, the compensator 901 of FIG. 9 returns to normal operating mode. As such, the number of active current mirror branches (K) in the current mirrors 913 of the variable multiplier 912 of FIG. 9 includes the normal operating ratio of current mirrors (e.g., the number of active current mirror branches (K)). Clearly depicted in FIG. 10, the startup time (e.g., settling time) of the output of the converter 304 (line 1010) is less than 40 microseconds.

Figure 11:
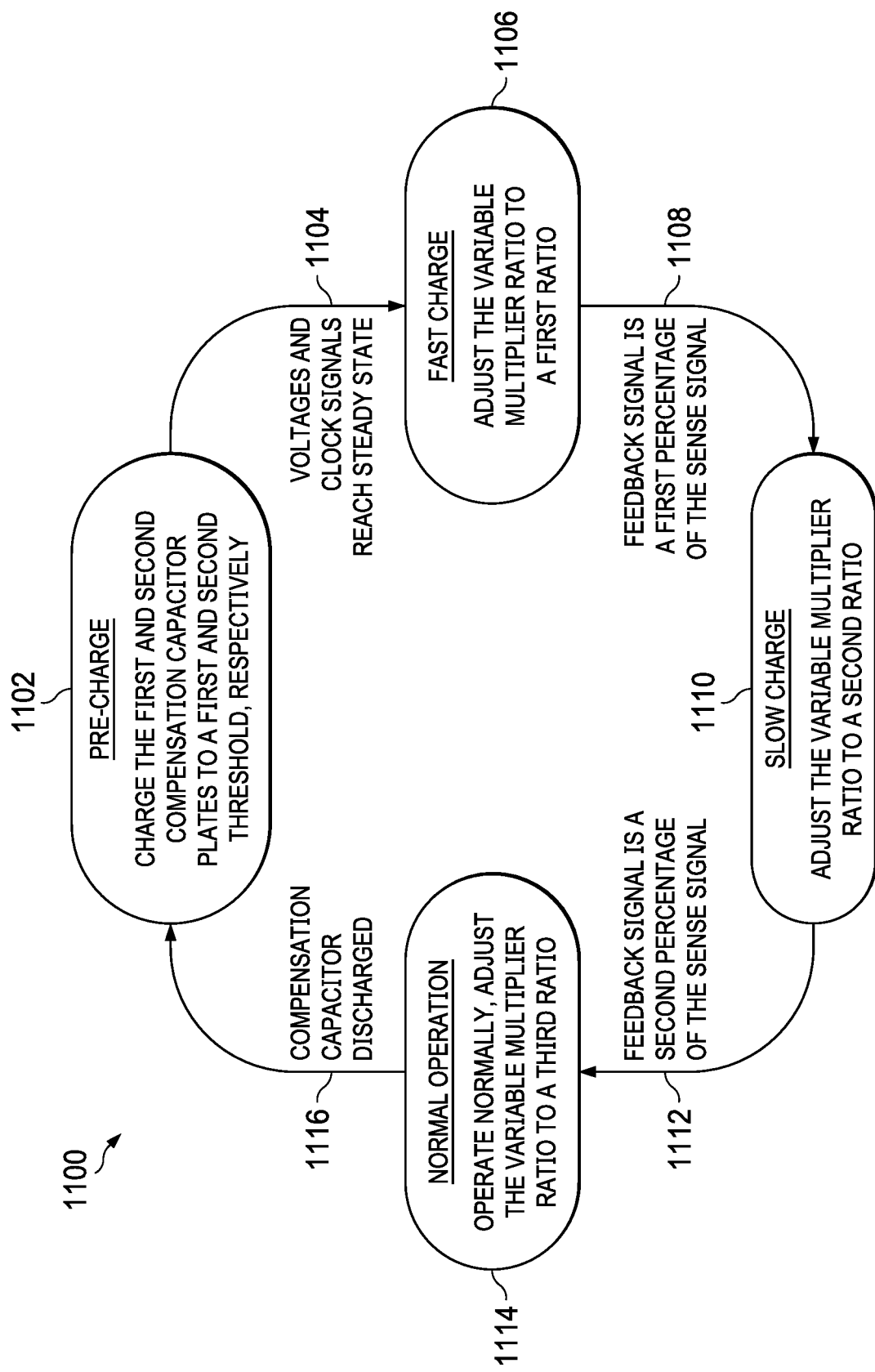
FIG. 11 is a state diagram representative of example modes of operation in which the compensator of FIG. 4, 5, or 9 may operate.

FIG. 11 is a state diagram 1100 representative of example modes of operation in which the compensator 410 or 901 of FIG. 4, 5, or 9 may operate. When in an example first state 1102, the compensator 410 or 901 of FIGS. 4, 5 and/or 9 may be in an example pre-charge mode. In the example first state 1102, the individual terminals of the example compensation capacitor 502 and/or 902 (e.g., the first terminal 504 or 904 and the second terminal 506 or 906) are charged to a first and second voltage threshold, respectively. Once the corresponding voltages and clock signals (e.g., e.g., the example first output of the first low-dropout regulator 402 (line 423), the example second output of the second low-dropout regulator 404 (line 425) and the example clock input (line 427)) are in steady state, the example first operating condition 1104 is satisfied.

In response, the compensator 410 or 901 enter an example second state 1106, which may be an example fast charge mode. In the example second state 1106, the compensator 410 or 901 or, more specifically, the variable multiplier 512 or 912, adjust the number of active current mirror branches in the example current mirrors 513 or 913 to a first ratio (e.g., 1:8). In other examples disclosed herein, the first ratio may be any numerical ratio that is lower than the normal operating mode ratio. Once the feedback signal (line 417) is a first percentage (e.g., 50%) of the sense signal (line 415), the example second operating condition 1108 is satisfied.

In response, the compensator 410 or 901 enter an example third state 1110, which may be an example slow charge mode. In the example third state 1110, the compensator 410 or 901 or, more specifically, the variable multiplier 512 or 912, adjust the number of active current mirror branches in the example current mirrors 513 or 913 to a second ratio (e.g., 1:24). In other examples disclosed herein, the second ratio may be any numerical ratio that is higher than the normal operating mode ratio. Once the feedback signal (line 417) is a second percentage (e.g., 95%) of the sense signal (line 415), the example third operating condition 1112 is satisfied.

In response, the compensator 410 or 901 enter an example fourth state 1114, which may be an example normal operation mode. In the example fourth state 1114, the compensator 410 or 901 or, more specifically, the variable multiplier 512 or 912, adjust the number of active current mirror branches in the example current mirrors 513 or 913 to a third ratio (e.g., 1:16). In other examples disclosed herein, the third ratio may be any numerical ratio that is the normal operating mode ratio. If the compensation capacitor 502 or 902 is fully discharged, the example fourth operating condition 1116 is satisfied. In response, the compensator 410 or 901 enter the example first state 1102.

While an example manner of implementing the compensator 410, 901 of FIGS. 4, 5, and 9 is illustrated in FIGS. 4, 5, and 9, one or more of the elements, processes and/or devices illustrated in FIGS. 4, 5, and 9 may be combined, divided, re-arranged, omitted, eliminated and/or implemented in any other way. Further, the example initiator 406, the example first threshold comparator 412, the example second threshold comparator 414, the example variable multiplier 512, the example current mirrors 513, the example variable multiplier 912, the example current mirrors 913 and/or, more generally, the example compensator 410, 901 of FIG. 4, 5, or 9 may be implemented by hardware, software, firmware and/or any combination of hardware, software and/or firmware. Thus, for example, any of the example initiator 406, the example first threshold comparator 412, the example second threshold comparator 414, the example variable multiplier 512, the example current mirrors 513, the example variable multiplier 912, the example current mirrors 913 and/or, more generally, the example compensator 410, 901 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example initiator 406, the example first threshold comparator 412, the example second threshold comparator 414, the example variable multiplier 512, the example current mirrors 513, the example variable multiplier 912, the example current mirrors 913 is/are hereby expressly defined to include a non-transitory computer readable storage device or storage disk such as non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc., and/or any other type of random access memory (RAM) device), etc., including the software and/or firmware. Further still, the example compensator 410, 901 of FIG. 4, 5, or 9 may include one or more elements, processes and/or devices in addition to, or instead of, those illustrated in FIG. 4, 5, or 9, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 12:
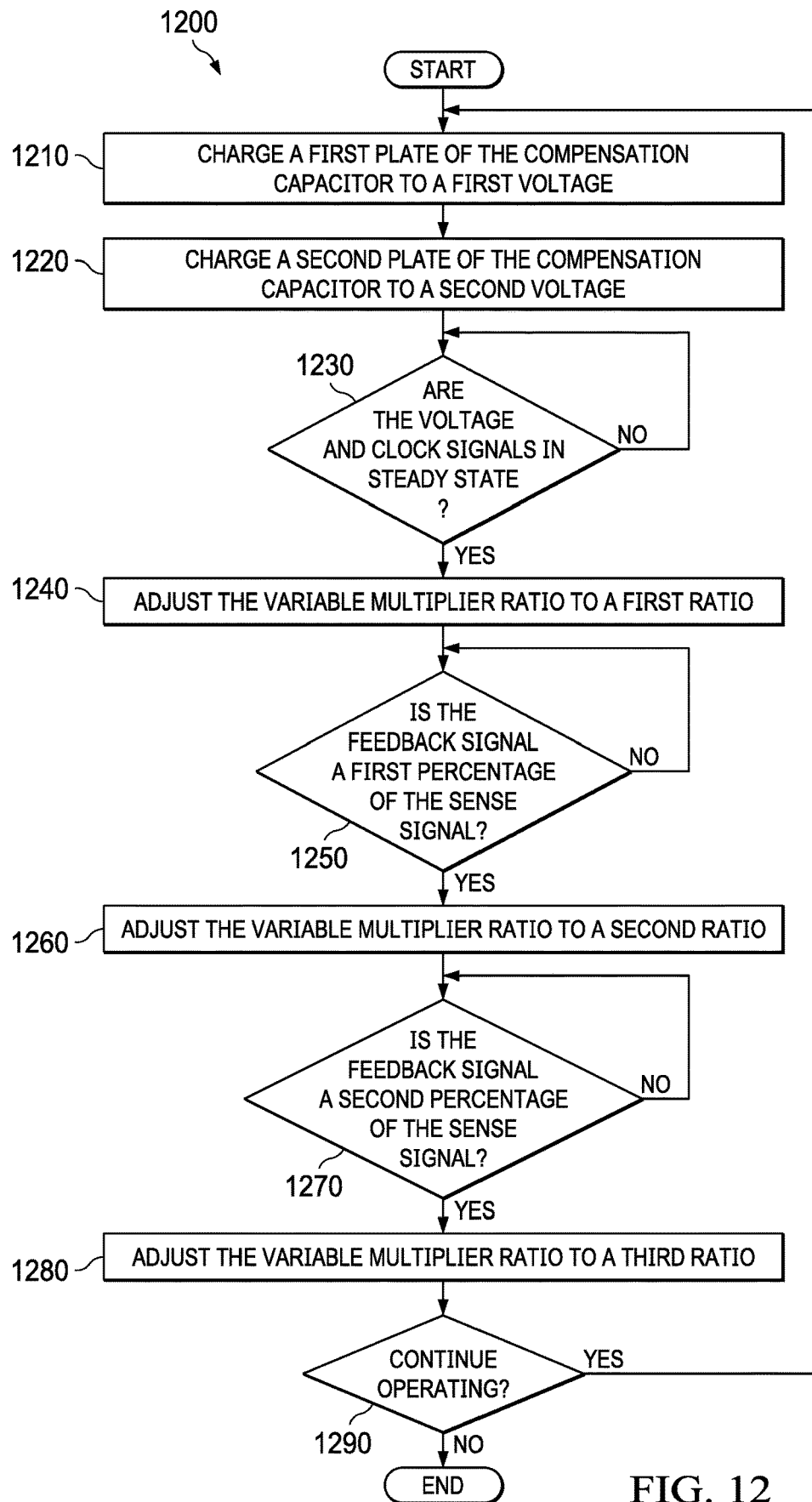
FIG. 12 is a flowchart representative of machine readable instructions which may be executed to implement the compensator of FIGS. 4 and 5 or the compensator of FIG. 9, to improve switching conditions of the example gate driver IC of FIG. 3 by adjusting the charge of an example compensation capacitor.

A flowchart representative of example hardware logic, machine readable instructions, hardware implemented state machines, and/or any combination thereof for implementing the controller 346 of FIG. 3 and/or the compensator 410, 901 of FIG. 4, 5, or 9 is shown in FIG. 12. The machine readable instructions may be an executable program or portion of an executable program for execution by one or more computer processors, one or more microcontrollers, etc. For example, the machine readable instructions may be executed by one or more integrated circuits, logic circuits, microprocessors, GPUs, DSPs, or controllers from any desired family or manufacturer. For example, the one or more integrated circuits, logic circuits, microprocessors, GPUs, DSPs, or controllers may be semiconductor based (e.g., silicon based) device(s). The program may be embodied in software stored on a non-transitory computer readable storage medium such as non-volatile memory, volatile memory, etc., associated with the one or more computer processors, the one or more microcontrollers, etc., but the entire program and/or parts thereof could alternatively be executed by a device other than the one or more computer processors, the one or more microcontrollers, etc., and/or embodied in firmware or dedicated hardware. Further, although the example program is described with reference to the flowchart illustrated in FIG. 12, many other methods of implementing the controller 346 and/or the example compensator 410, 901 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

In some examples disclosed herein, a hardware processor (e.g., the controller 346) may be used to execute the instructions of FIG. 12 to implement the controller 346 of FIG. 3. The hardware processor can be, for example, a server, an electronic control unit (ECU) of a vehicle, a personal computer, a workstation, or any other type of computing device. The hardware processor may be a semiconductor based (e.g., silicon based) device. For example, the hardware processor may obtain a measurement (e.g., a current measurement, a voltage measurement, etc.) associated with the switch 312 of FIG. 3, and/or generate a control signal that is to be obtained by the gate driver IC 302 of FIG. 3. In such examples, the hardware processor can generate a control signal that is to be obtained by the output stage IC 316 of the gate driver IC 302 to turn on or off the one or more switches to provide power or remove power from the load 358 of FIG. 3. For example, the hardware processor may direct and/or otherwise cause the output stage IC 316 to turn off the switch 312 in response to an indication of the temperature of the switch 312.

As mentioned above, the example processes of FIG. 12 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 12 is a flowchart 1200 representative of machine readable instructions which may be executed to implement the controller 346, the compensator 410 of FIGS. 4 and 5 and/or the compensator 901 of FIG. 9, to improve switching conditions of the example gate driver IC 302 of FIG. 3 by adjusting the charge of an example compensation capacitor 502 of FIG. 5 or the compensation capacitor 902 of FIG. 9. In the example illustrated in FIG. 12, the initiator 406 transmits a trigger to the example first switch (e.g., the example first switch 508 or the example first switch 908) to operate (e.g., close) and, thus, charge the example first terminal (e.g., the example first terminal 504 or the example first terminal 904) to a first voltage potential (block 1210). In examples disclosed herein, the first voltage potential is governed by the proportional voltage generated by the example voltage divider (e.g., the voltage generated by the example voltage divider 518 at node 521 node or the voltage generated by the example voltage divider 920 at node 921).

Additionally, the initiator 406 transmits a trigger to the example second switch (e.g., the example second switch 510 or the example second switch 910) to operate (e.g., close) and, thus, charge the example second terminal (e.g., the example second terminal 506 or the example second terminal 906) to a second voltage potential (block 1220). In examples disclosed herein, the second voltage potential is governed by either the voltage potential at the output connector 526 or a proportional voltage generated by the example voltage divider (e.g., the voltage generated by the example voltage divider 920 at node 923).

The initiator 406 determines if the corresponding voltage and clock signals (e.g., the example first output of the first low-dropout regulator 402 (line 423), the example second output of the second low-dropout regulator 404 (line 425) and the example clock input (line 427)) signals are in steady state (block 1230). If any of the above-mentioned voltage and clock signals are not in steady state, control returns to block 1230.

If the above-mentioned voltage and clock signals are in steady state, the initiator 406 transmits a signal to the example variable multiplier (e.g., the variable multiplier 512 or the variable multiplier 912) to adjust the multiplier ratio to a first ratio (block 1240). The variable multiplier (e.g., the variable multiplier 512 or the variable multiplier 912) determines if the feedback signal (line 417) is a first percentage (e.g., 50%) of the sense signal (line 415) (e.g., determines if the example first trigger is sent by the example first threshold comparator 412) (block 1250). If the variable multiplier (e.g., the variable multiplier 512 or the variable multiplier 912) does not determine the feedback signal (line 417) is a first percentage (e.g., 50%) of the sense signal (line 415), control returns to block 1250. If the variable multiplier (e.g., the variable multiplier 512 or the variable multiplier 912) does determine the feedback signal (line 417) is a first percentage (e.g., 50%) of the sense signal (line 415), the variable multiplier (e.g., the variable multiplier 512 or the variable multiplier 912) adjusts the multiplier ratio to a second ratio (block 1260). In examples disclosed herein, the first voltage threshold determined during the instruction illustrated in block 1250 may vary.

The variable multiplier (e.g., the variable multiplier 512 or the variable multiplier 912) determines if the feedback signal (line 417) is a second percentage (e.g., 95%) of the sense signal (line 415) (e.g., determines if the example second trigger is sent by the example second threshold comparator 414) (block 1270). If the variable multiplier (e.g., the variable multiplier 512 or the variable multiplier 912) does not determine the feedback signal (line 417) is a second percentage (e.g., 95%) of the sense signal (line 415), control returns to block 1270. If the variable multiplier (e.g., the variable multiplier 512 or the variable multiplier 912) does determine the feedback signal (line 417) is a second percentage (e.g., 95%) of the sense signal (line 415), the variable multiplier (e.g., the variable multiplier 512 or the variable multiplier 912) adjusts the multiplier ratio to a third ratio (block 1280). In examples disclosed herein, the second voltage threshold determined during the instruction illustrated in block 1270 may vary.

Additionally, the compensator (e.g., the compensator 410 or the compensator 901) determines whether to continue operating (block 1290). Examples in which the compensator (e.g., the compensator 410 of the compensator 901) cease operating include loss of power, damaged devices, etc. Alternatively, if the compensator (e.g., the compensator 410 or the compensator 901) determines to continue operating, control returns to block 1210.

From the foregoing, it will be appreciated that example methods, apparatus and articles of manufacture have been disclosed that improve switching conditions in a closed loop system. The disclosed methods, apparatus and articles of manufacture improve the efficiency of using a computing device by charging and discharging individual terminals of a compensation capacitor in response to meeting various voltage thresholds. The disclosed methods, apparatus and articles of manufacture control the slew rate of the compensation capacitor to improve the switching characteristics of an example isolated high-power and/or high-current gate driver IC. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A device comprising:
a first switch adapted to be coupled to a first node;
a second switch adapted to be coupled to a second node;
a capacitor including a first terminal and a second terminal, wherein the first terminal is coupled the first switch, and wherein the second terminal is coupled to the second switch;
a first multiplier coupled to the first terminal and to the second terminal, wherein the first multiplier is adapted to be coupled to at least a third node and a fourth node;
a second multiplier coupled to the first terminal and to the second terminal; and
a buffer including an input terminal and an output terminal, the output terminal coupled to first switch, and the input terminal adapted to be coupled the first node.

2. The device of claim 1, wherein the input terminal is coupled to a fifth node of a voltage divider, and wherein the voltage divider is adapted to be coupled to the first node.

3. The device of claim 1, further including a second buffer, wherein the second buffer includes a second input terminal and a second output terminal, wherein the second output terminal is coupled to the second switch, and wherein the second input terminal is adapted to be coupled the first node.

4. The device of claim 1, wherein the first multiplier is adapted to be coupled to at least one trigger, and wherein the trigger is to adjust a multiplication ratio of the first multiplier.

5. The device of claim 1, wherein the first terminal is adapted to be charged to a first threshold and wherein the second terminal is adapted to be charged to a second threshold.

6. The device of claim 5, wherein the second terminal is adapted to discharge to the first threshold.

7. The device of claim 1, wherein the first multiplier includes a plurality of current mirrors, and wherein the plurality of current mirrors are to generate a first current gain to adjust a multiplication ratio of the first multiplier.

8. A system to improve switching conditions, the system comprising:
a first capacitor;
a first stage coupled to the first capacitor;
a second stage coupled to the first capacitor, wherein the second stage includes a converter to reduce settling time when converting an analog signal to a digital signal by:
charging a first terminal of a second capacitor to a first voltage and charging a second terminal of the second capacitor to a second voltage;
in response to a first voltage threshold satisfied, adjusting a multiplier to a first ratio; and
in response to a second voltage threshold satisfied, adjusting the multiplier to a second ratio; and
the converter to transmit the digital signal to the first stage via the first capacitor.

9. The system of claim 8, further including a temperature sensor coupled to the second stage, wherein the temperature sensor is to provide the analog signal.

10. The system of claim 8, wherein the first ratio corresponds to a first slew rate of the second capacitor, wherein the second ratio corresponds to a second slew rate of the second capacitor.

11. The system of claim 8, wherein the first capacitor is to capacitively isolate the first stage from the second stage.

12. The system of claim 8, wherein the second stage is coupled to a silicon carbide transistor.

13. The system of claim 12, wherein the first stage is coupled to a controller, and wherein the controller is to adjust a switching speed of the silicon carbide transistor in response to the digital signal.

14. A method to improve switching conditions when converting an analog signal to a digital signal, the method comprising:
charging a first terminal of a capacitor to a first voltage using a compensator;
charging a second terminal of the capacitor to a second voltage using the compensator;
in response to a first trigger indicating a feedback signal related to the second voltage meets a first voltage threshold, adjusting a multiplier ratio to a first ratio using a multiplier;
in response to a second trigger indicating the feedback signal related to the second voltage meets a second voltage threshold, adjusting the multiplier ratio to a second ratio using the multiplier; and
transmitting the digital signal to a low-voltage stage using the compensator, the digital signal proportional to the feedback signal.

15. The method of claim 14, further including adjusting the multiplier ratio to the first ratio after determining at least the first voltage and the second voltage are in steady state.

16. The method of claim 14, further including:
comparing, using a first comparator, the feedback signal with a sense signal to output the first trigger; and
comparing, using a second comparator, the feedback signal with the sense signal to output the second trigger.

17. The method of claim 14, wherein the digital signal is transmitted to the low-voltage stage via an isolation barrier.

18. The method of claim 17, further including adjusting, in response to the digital signal, a switching speed of a silicon carbide transistor using a controller.

19. The method of claim 14, further including sensing the analog signal using a temperature sensor, wherein the analog signal corresponds to a temperature of a transistor.

\* \* \* \* \*